United States Patent [19]
Yoshizawa et al.

[11] Patent Number: 5,862,461
[45] Date of Patent: Jan. 19, 1999

[54] TRANSMITTING APPARATUS AND METHOD OF ADJUSTING GAIN OF SIGNAL TO BE TRANSMITTED, AND RECEIVING APPARATUS AND METHOD OF ADJUSTING GAIN OF RECEIVED SIGNAL

[75] Inventors: Atsushi Yoshizawa, Kanagawa; Tomoya Yamaura, Tokyo; Norio Shimo, Kanagawa, all of Japan

[73] Assignee: Sony Corporation, Tokyo, Japan

[21] Appl. No.: 703,214

[22] Filed: Aug. 26, 1996

[30] Foreign Application Priority Data

Aug. 31, 1995 [JP] Japan ...................................... 7-248697
Aug. 31, 1995 [JP] Japan ...................................... 7-248698

[51] Int. Cl.[6] ........................................................ H04B 1/04
[52] U.S. Cl. ........................... 455/127; 455/115; 455/126; 330/51; 330/124 R
[58] Field of Search ..................................... 455/126, 127, 455/115, 552, 553; 330/51, 295, 284, 84, 126, 124 R; 375/295, 297

[56] References Cited

U.S. PATENT DOCUMENTS

| | | | |
|---|---|---|---|
| 5,126,686 | 6/1992 | Tam | 330/134 |
| 5,457,425 | 10/1995 | Tahara | 330/51 |
| 5,530,923 | 6/1996 | Heinonen et al. | 455/126 |

Primary Examiner—Wellington Chin
Assistant Examiner—Lee Nguyen
Attorney, Agent, or Firm—Jay H. Maioli

[57] ABSTRACT

A transmitting apparatus which can suppress unnecessary power consumption. An optimal signal line is selected from a plurality of signal lines (53–56) having different gains provided by respective signal amplifying devices to perform gain adjustment on a signal to be transmitted, which is supplied to an input terminal (58), so as to optimize power consumption of each signal amplifying device in accordance with a gain value, and to halt the operation of the signal amplifying device on a signal line which is not selected. Therefore, unnecessary power consumption can be suppressed.

39 Claims, 19 Drawing Sheets

TRANSMITTING APPARATUS AND METHOD OF ADJUSTING GAIN OF SIGNAL TO BE TRANSMITTED, AND RECEIVING APPARATUS AND METHOD OF ADJUSTING GAIN OF RECEIVED SIGNAL

BACKGROUND OF THE INVENTION

1. Field of the Invention

This invention relates to a transmitting apparatus and a method of adjusting the gain of a signal to be transmitted, and a receiving apparatus and a method of adjusting the gain of a received signal, and more particularly, is suitable for use in mobile radio communications systems such as cellular telephones and so on.

2. Description of the Related Art

Conventionally, in this type of mobile radio communications system, communications are made between a mobile terminal and a base station through an interconnecting radio channel. In such a mobile radio communications system, the signal level is always changing due to changes in communication distance between the mobile terminal and the base station, the influence of fading on a transmission channel, and so on.

For this reason, the mobile station is provided with a gain adjusting circuit such as an amplifier and an attenuator, such that the gain adjusting circuit absorbs fluctuating level portions in a received signal, whereby a demodulator is supplied with the received signal having its level adjusted to be constant. The transmission side of the mobile terminal is also provided with a gain adjusting circuit which adjusts a signal to be transmitted to a desired signal level such that a constant signal level is supplied to the base station.

In this way, a mobile terminal is generally provided with any gain adjusting circuit for both transmission and reception in order to avoid the influence of level fluctuations. In this event, a gain adjusting width required by the gain adjusting circuit differs from one system to another.

If a gain adjusting width required by a system extends over a range of 80 to 90 [dB], it is extremely difficult to realize this only with a single gain adjusting circuit from a technical point of view, in consideration of the isolation and dynamic range of elements. Even if it is technically possible, it is almost infeasible, taking into account the manufacturing cost.

To avoid this problem, conventionally, as shown in FIG. 1, a gain adjusting circuit for transmission is divided into a plurality of portions, in a transmitter circuit 1 in a mobile terminal. For example, if gain adjustment of 80 [dB] is required by a whole system, a level change over 80 [dB] must be achieved at a transmission antenna 2. Thus, 50 [dB] is adjusted by an intermediate frequency (IF frequency) and the remaining 30 [dB] by a radio frequency (RF frequency).

More specifically, an IF signal S1 having a constant level, fed from an input terminal 3, is inputted through an IF signal line 4 to a first variable gain amplifier 5 in which the IF signal S1 is adjusted for the gain by a width of 50 [dB]. The IF signal S1 is next inputted to a frequency mixer 6 in which the IF signal S1 is subjected to a frequency conversion using a local signal S2 to be converted into an RF signal S3. The RF signal S3, after passing through a bandpass filter (BPF) 7 for removing unnecessary frequency components, is inputted to a second variable gain amplifier 8 in which the RF signal S3 is adjusted for the gain by a width of 30 [dB]. Finally, the gain adjusted RE signal S3 undergoes a constant signal amplification (for example, approximately 20 [dB]) by a power amplifier 9, and then is inputted through an RF signal line 10 to a bandpass filter 11 for removing herein unnecessary frequency components. The RF signal S3 having the unnecessary components removed is finally supplied to the transmission antenna 2 as a signal to be transmitted having desired power.

In the transmitter circuit 1 as described above, since the gain adjustment is divided into two steps, a signal level change from the input terminal (3) to the output terminal (2) can be limited to 50 [dB] at maximum. Additionally, since this results in a smaller difference between a maximum level and minimum level of a signal at connecting points of respective elements, the dynamic range of each element can be reduced. As a result, the transmitter circuit 1 can provide a wide dynamic range as a whole while limiting the dynamic range of each element.

As another trend in recent years, the mobile radio communications system has utilized a wider frequency bandwidth with an increasing number of communication channels. In this case, however, if the BPFs 7, 11 as illustrated in FIG. 1 are to be formed of a single element, this causes inconveniences such as an extremely large physical volume of the filter, electrically large loss occurring in the pass band (in other words, required characteristics cannot be satisfied), and so on.

To avoid such inconveniences, conventionally, the pass band of a bandpass filter for a wide frequency bandwidth is divided into a plurality of regions so that the same function as a single bandpass filter is implemented by a plurality of filter elements. For example, as illustrated in FIG. 2 in which parts corresponding to those in FIG. 1 are designated the same reference numerals, in a transmitter circuit 20, the each pass band of the BPFs 7, 11 is divided into two so that a single pass band is implemented by two filter elements.

More specifically, the BPF 7 is composed of two bandpass filters 21, 22 having different pass bands from each other and switches 23, 24 for switching these filters. A desired characteristic can be obtained by changing over the switches 23, 24 in accordance with the frequency of an RF signal S3. Also, the BPF 11 is composed of two bandpass filters 25, 26 having different pass bands from each other and switches 27, 28 for switching these filters. A desired characteristic can be obtained by changing over the switches 27, 28 in accordance with the frequency of the RF signal S3. In this way, the BPFs 7, 11 each having a smaller volume and a smaller loss can be realized, even if the physical volumes and loss of the switches 23, 24 and 27, 28 are negatively evaluated. Also, a reduction in size and power consumption can be achieved in the transmitter circuit 20 as a whole.

On the other hand, to avoid the above-mentioned problem with respect to the reception, a receiver circuit 30 in a mobile terminal conventionally has a gain adjusting circuit divided into a plurality of portions, as illustrated in FIG. 3. For example, if a received signal includes level fluctuations over 80 [dB] at a reception antenna 31 in the system, the receiver circuit 30 is required to adjust at least 80 [dB] of gain in order to make the signal level constant at a signal output terminal 32. Thus, in the receiver circuit 30, 50 [dB] is adjusted by an intermediate frequency (IF frequency) and the remaining 30 [dB] by a radio frequency (RF frequency).

An RF signal S5 having level fluctuations over 80 [dB] received by the reception antenna 31 is passed through a bandpass filter 33 to remove unnecessary frequency components, and subsequently inputted to a first variable gain amplifier 35 through an RF signal line 34. The first variable gain amplifier 35 applies the RF signal S5 with gain adjustment of a width of 30 [dB] in accordance with a signal level. Thus, the RF signal S5 outputted from the first variable gain amplifier 35 will have level fluctuations over 30 [dB]. This RF signal S5, after unnecessary frequency components are removed therefrom by a bandpass filter 36, is inputted to a frequency mixer 37, where it is subjected to frequency conversion using a local signal S6 to be converted into an IF signal S7.

The IF signal S7 is inputted to a bandpass filter 38, where nonlinear distortions generated by the frequency mixer 37 and frequency components of disturbing waves are removed, and then inputted to a second variable gain amplifier 39. The second variable gain amplifier 39 applies gain adjustment of a width of 50 [dB] to the inputted IF signal S7 to make the signal level of the IF signal S7 constant. In this way, the signal output terminal 32 is supplied with the IF signal S7 having its level constant.

In the receiver circuit 30 as described above, since the gain adjustment is divided into two steps, a signal level change from the input terminal (31) to the output terminal (32) can be limited to 50 [dB] at maximum. Additionally, since this results in reducing the difference between a maximum level and minimum level of a signal at connecting points of respective elements, the dynamic range of each element can be reduced. As a result, the receiver circuit 30 can provide a wide dynamic range as a whole while limiting the dynamic range of each element.

In recent years, as another movement, the mobile radio communications system tends to utilize a wider frequency bandwidth with an increasing number of communication channels. In this case, however, if the BPFs 33, 36 as illustrated in FIG. 3 are to be formed of a single element, this causes inconveniences such as an extremely large physical volume of the filter, electrically large loss occurring in the pass band (in other words, required characteristics cannot be satisfied), and so on.

To avoid such inconveniences, conventionally, the pass band of a bandpass filter for a wide frequency bandwidth is divided into a plurality of regions such that a single bandpass filter is implemented by a plurality of filter elements. For example, as illustrated in FIG. 4 in which parts corresponding to those in FIG. 3 are designated the same reference numerals, a receiver circuit 40 has a single bandpass filter implemented by a two filter elements for a pass band divided into two.

More specifically, a BPF 33 is composed of two bandpass filters 41, 42 having different pass bands from each other and switches 43, 44 for switching these filters. A desired characteristic can be obtained by changing over the switches 43, 44 in accordance with the frequency of an RF signal S5. Also, the BPF 36 is composed of two bandpass filters 45, 46 having different pass bands from each other and switches 47, 48 for switching these filters. A desired characteristic can be obtained by changing over the switches 47, 48 in accordance with the frequency of the RF signal S5. In this way, the BPFs 33, 36 each having a smaller volume and smaller loss can be realized, even if the physical volumes and loss of the switches 43, 44 and 47, 48 are negatively evaluated. Additionally, a reduction in size and power consumption can be achieved in the receiver circuit 40 as a whole.

The transmitter circuits 1, 20 as mentioned above have a problem that the variable gain amplifiers 5, 8 and the power amplifier 9 must be always supplied with electric power for the gain adjustment, so that electric power is consumed for nothing.

Particularly, since the power amplifier 9 is an amplifier at the RF stage, its power addition efficiency generally tends to significantly degrade if a low level signal is inputted thereto. Thus, even if the variable gain amplifier 8 performs the gain adjustment, there is a fear that the power amplifier 9 would further consume electric power for nothing.

If electric power is consumed for nothing in this way in the transmitter circuits 1, 20, a communication available time will be shortened in a battery driven mobile terminal, thus causing a grave problem.

Similarly, the receiver circuits 30, 40 as mentioned above have a problem that the variable gain amplifiers 35, 39 must be always supplied with electric power for the gain adjustment, so that electric power is consumed for nothing. If electric power is consumed for nothing in this way in the receiver circuits 30, 40, a stand-by time and a communication available time will be shortened in a battery driven mobile terminal, thus causing a grave problem.

Also, in the receiver circuits 30, 40, if disturbing waves are present in a received signal (S5) in a pass band of the BPF 33, the variable gain amplifier 35 or the frequency mixer 37 may be saturated depending on the level of the disturbing waves, possibly resulting in restraining the received signal to cause significant degradation in the reception sensitivity.

SUMMARY OF THE INVENTION

In view of the foregoing, an object of this invention is to provide a transmitting apparatus and a method of adjusting the gain of a signal to be transmitted which are capable of suppressing unnecessary power consumption, and a receiving apparatus and a method of adjusting the gain of a received signal which are capable of suppressing useless power consumption.

The foregoing objects and other objects of the invention have been achieved by the provision of the transmitting apparatus having gain varying means. The gain varying means comprises: a plurality of signal lines for connecting, on a one-by-one basis, a plurality of output terminals of a first signal line selecting means to a plurality of input terminals of a second signal line selecting means, and having different gains from each other by signal amplifying means; and signal line control means for controlling the switching of connection relationships in the first and second signal line selecting means by applying control signals to control terminals of the first and second signal line selecting means, in which the signal line control means selects an optimal signal line from among the plurality of signal lines to perform gain adjustment on a signal to be transmitted, which is supplied to an input terminal of the first signal line selecting means. In this way, power consumption of each signal amplifying means can be optimized in accordance with its gain value, and signal amplifying means in signal lines not selected are prevented from operating, thus making it possible to suppress unnecessary power consumption.

Further, according to this invention, the second signal line selecting means is formed by a directional coupler composed of two parallel lines. The signal line selecting means of the gain varying means is formed by a directional coupler, so that the insertion loss generated at the signal line selecting means can be reduced.

Further, according to this invention, the second line of the directional coupler forming the second signal line selecting means is connected to predetermined signal level detecting means. The signal line selecting means which is the nearest to the output side is formed by a directional coupler, and the second line of the directional coupler is connected to predetermined signal level detecting means, so that the signal level detecting means takes in the voltage value of a signal which appears on the second line and can easily detect the transmission signal level to be output finally. Therefore, the signal line selecting means is used in common with the signal level extracting means in the detection of signal level so as to further simplify the construction.

Further, according to this invention, a gain varying means contained in the transmitting apparatus comprises: a plurality of first signal lines for connecting, on a one-by-one basis, a plurality of output terminals of a first signal line selecting means to a plurality of input terminals of a second signal line selecting means, and having different gains from each other by signal amplifying means; a plurality of second signal lines for connecting, on a one-by-one basis, a plurality of output terminals of a third signal line selecting means to a plurality of input terminals of a first signal line selecting means, and having different pass band characteristics from each other by filter means; and signal line control means for controlling the switching of connection relationships in the first, second, and third signal line selecting means by applying control signals to control terminals of the first, second, and third signal line selecting means, in which the signal line control means selects an optimal signal line from among the first and second signal lines to perform gain adjustment on a signal to be transmitted, which is supplied to an input terminal of the third signal line selecting means, and to switch a pass band. In this way, since signal amplifying means in signal lines not selected can be prevented from operating, unnecessary power consumption can be suppressed. Simultaneously, the pass band characteristics can also be switched.

Further, according to this invention, a gain varying means contained in the transmitting apparatus comprises: a plurality of first signal lines for connecting, on a one-by-one basis, a plurality of output terminals of a first signal line selecting means to a plurality of input terminals of a second signal line selecting means, and having different gains from each other by signal amplifying means; a plurality of second signal lines for connecting, on a one-by-one basis, a plurality of output terminals of a second signal line selecting means to a plurality of input terminals of a third signal line selecting means, and having different pass band characteristics from each other by filter means; and signal line control means for controlling the switching of connection relationships in the first, second, and third signal line selecting means by applying control signals to control terminals of the first, second, and third signal line selecting means, in which the signal line control means selects an optimal signal line from among the first and second signal lines to perform gain adjustment on a signal to be transmitted, which is supplied to an input terminal of the first signal line selecting means, and to switch a pass band. In this way, since signal amplifying means in signal lines not selected can be prevented from operating, unnecessary power consumption can be suppressed. Simultaneously, the pass band characteristics can also be switched.

Further, according to this invention, a gain varying means contained in the transmitting apparatus comprises: a plurality of first signal lines for connecting, on a one-by-one basis, a plurality of output terminals of a first signal line selecting means to a plurality of input terminals of a second signal line selecting means, and having different gains from each other by signal amplifying means; a plurality of second signal lines for connecting, on a one-by-one basis, a plurality of output terminals of a third signal line selecting means to a plurality of input terminals of a first signal line selecting means, and having different pass band characteristics from each other by filter means; a plurality of third signal lines for connecting, on a one-by-one basis, a plurality of output terminal of a second signal line selecting means to a plurality of input terminal of a fourth signal line selecting means, and having different pass band characteristics from each other by filter means; and signal line control means for controlling the switching of connection relationships in the first, second, third, and fourth signal line selecting means by applying control signals to control terminals of the first, second, third, and fourth signal line selecting means, in which the signal line control means selects an optimal signal line from among the first, second, and third signal lines to perform gain adjustment on a signal to be transmitted, which is supplied to an input terminal of the third signal line selecting means, and to switch a pass band. In this way, since signal amplifying means in signal lines not selected can be prevented from operating, unnecessary power consumption can be suppressed. Simultaneously, the pass band characteristics can also be switched.

Further, according to this invention, a plurality of signal lines having different gain each other are previously provided by the signal amplifying means. Then, the level of transmission signal required at the output side of the signal line is examined and the level of transmission signal at the input side of the signal line is examined to determine which signal line to be selected in accordance with the calculated level difference between two levels. The signal line is appropriately selected in accordance with the determined result so as to perform an appropriate gain adjustment on a signal to be transmitted. Therefore, signal amplifying means in signal lines not selected can be prevented from operating, unnecessary power consumption can be suppressed.

Further, the foregoing objects and other objects of the invention have been achieved by the provision of the receiving apparatus having gain varying means. The gain varying means comprises: a plurality of signal lines for connecting, on a one-by-one basis, a plurality of output terminals of a first signal line selecting means to a plurality of input terminals of a second signal line selecting means, and having different gains from each other by signal amplifying means; and signal line control means for controlling the switching of connection relationships in the first and second signal line selecting means by applying control signals to control terminals of the first and second signal line selecting means, wherein the signal line control means selects an optimal signal line from among the plurality of signal lines to perform gain adjustment on a received signal supplied to an input terminal of the first signal line selecting means. In this way, power consumption of each signal amplifying means can be optimized in accordance with its gain value, and signal amplifying means in signal lines not selected can be prevented from operating, thus making it possible to suppress unnecessary power consumption. In addition, a signal line with a low gain is selected if a received signal has a sufficient signal level, so that even if disturbing waves are present in a receiving band, the signal amplifying means can be prevented from saturating to prevent the received signal from being restrained, thus making it possible to avoid a degraded reception sensitivity due to the disturbing waves.

Further, according to this invention, the first signal line selecting means is formed by a directional coupler composed of two parallel lines. The signal line selecting means of the gain varying means is formed by a directional coupler, so that the insertion loss generated at the signal line selecting means can be reduced.

Further, according to this invention, the second line of the directional coupler forming the first signal line selecting means is connected to predetermined signal level detecting means. The signal line selecting means which is in the nearest to the input side is formed by a directional coupler, and the second line of the directional coupler is connected to predetermined signal level detecting means, so that the signal level detecting means takes in the voltage value of a signal which appears on the second line and can easily detect the received signal level to be input. Therefore, the signal line selecting means is used in common with the signal level extracting means in the detection of signal levels so as to further simplify the construction.

Further, according to this invention, a gain varying means contained in the receiving apparatus comprises: a plurality of first signal lines for connecting, on a one-by-one basis, a plurality of output terminals of a first signal line selecting means to a plurality of input terminals of a second signal line selecting means, and having different gains from each other by signal amplifying means; a plurality of second signal lines for connecting, on a one-by-one basis, a plurality of output terminals of a third signal line selecting means to a plurality of input terminals of the first signal line selecting means, and having different pass band characteristics from each other by filter means; and signal line control means for controlling the switching of connection relationships in the first, second, and third signal line selecting means by applying control signals to control terminals of the first, second, and third signal line selecting means, in which the signal line control means selects an optimal signal line from among the first and second signal lines to perform gain adjustment on a received signal supplied to an input terminal of the third signal line selecting means, and to switch a pass band. In this way, since signal amplifying means in signal lines not selected can be prevented from operating, unnecessary power consumption can be suppressed. Simultaneously, the pass band characteristics can also be switched.

Further, according to this invention, a gain varying means contained in the receiving apparatus comprises: a plurality of first signal lines for connecting, on a one-by-one basis, a plurality of output terminals of a first signal line selecting means to a plurality of input terminals of a second signal line selecting means, and having different gains from each other by signal amplifying means; a plurality of second signal lines for connecting, on a one-by-one basis, a plurality of output terminals of a second signal line selecting means to a plurality of input terminals of the third signal line selecting means, and having different pass band characteristics from each other by filter means; and signal line control means for controlling the switching of connection relationships in the first, second, and third signal line selecting means by applying control signals to control terminals of the first, second, and third signal line selecting means, in which the signal line control means selects an optimal signal line from among the first and second signal lines to perform gain adjustment on a received signal supplied to an input terminal of the first signal line selecting means, and to switch a pass band. In this way, since signal amplifying means in signal lines not selected can be prevented from operating, unnecessary power consumption can be suppressed. Simultaneously, the pass band characteristics can also be switched.

Further, according to this invention, a gain varying means contained in the receiving apparatus comprises: a plurality of first signal lines for connecting, on a one-by-one basis, a plurality of output terminals of a first signal line selecting means to a plurality of input terminals of a second signal line selecting means, and having different gains from each other by signal amplifying means; a plurality of second signal lines for connecting, on a one-by-one basis, a plurality of output terminals of a third signal line selecting means to a plurality of input terminals of the first signal line selecting means, and having different pass band characteristics from each other by filter means; a plurality of third signal lines for connecting, on a one-by-one basis, a plurality of output terminals of a second signal line selecting means to a plurality of input terminals of a fourth signal line selecting means, and having different pass band characteristics from each other by filter means; and signal line control means for controlling the switching of connection relationships in the first, second, third ,and fourth signal line selecting means by applying control signals to control terminals of the first, second, third, and fourth signal line selecting means, in which the signal line control means selects an optimal signal line from among the first, second, and third signal lines to perform gain adjustment on a received signal supplied to an input terminal of the third signal line selecting means, and to switch a pass band. In this way, since signal amplifying means in signal lines not selected can be prevented from operating, unnecessary power consumption can be suppressed. Simultaneously, the pass band characteristics can also be switched.

Further, according to this invention, a plurality of signal lines having different gain from each other are previously provided by the signal amplifying means. Then, the level of received signal supplied to the input side of the signal line is examined. The signal line is appropriately selected in accordance with the examined signal level to output the received signal of a desired signal level to the output side of signal line so as to perform an optimal gain adjustment on a received signal. Therefore, signal amplifying means in signal lines not selected can be prevented from operating, unnecessary power consumption can be suppressed.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Preferred embodiments of this invention will be described with reference to the accompanying drawings:

(1) Transmitter Circuit
(1—1) First Embodiment

Figure 5:
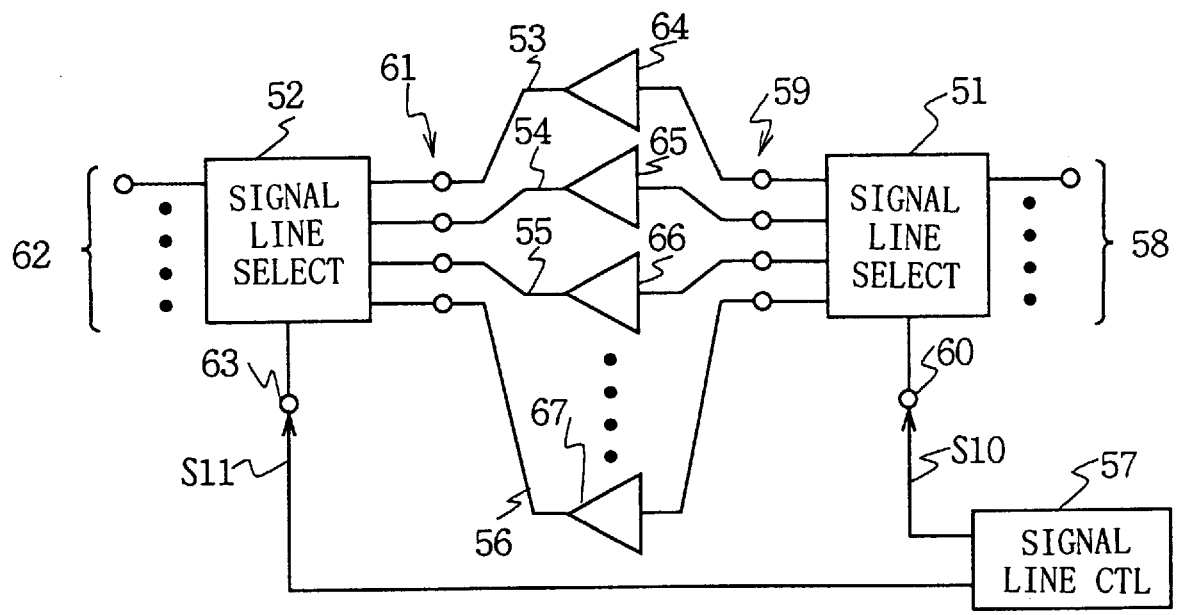
FIG. 5 is a block diagram showing a gain varying means of the transmitter circuit used for explaining the principles of the present invention.

First, the principles of a transmitter circuit will be described with reference to FIG. 5. In a transmitter circuit applying the present invention, a gain varying means 50 as illustrated in FIG. 5 is utilized to perform gain adjustment while suppressing unnecessary power consumption.

Generally, the gain varying means 50 is composed of first and second signal line selecting means 51, 52 each having a plurality of input and output terminals; a plurality of signal lines 53 to 56 having different gains for connecting between terminals of the first and second signal line selecting means 51, 52; and a signal line control means 57 for controlling selecting operations of the first and second signal line selecting means 51, 52.

First, the first signal line selecting means 51 has at least one input terminal 58, a plurality of output terminals 59, and a control terminal 60, and is configured such that it can switch a connection relationship between the input terminal 58 and the output terminals 59 in response to a control signal S10 supplied to the control terminal 60.

The second signal line selecting means 52, in turn, has a plurality of input terminals 61 and at least one output terminal 62, and a control terminal 63, and is configured such that it can switch a connection relationship between the input terminals 61 and the output terminal 62 in response to a control signal S11 supplied to the control terminal 63.

The output terminals 59 of the signal line selecting means 51 are connected to the input terminals 61 of the signal line selecting means 52 by the signal lines 53 to 56 having different gains from each other. In this configuration, signal amplifying means 64 to 67 having different gains from each other are inserted in the signal lines 53 to 56, respectively, so that the respective signal lines are provided with different gains.

The signal line control means 57, which controls selecting operations of the first and second signal line selecting means 51, 52, determines signal lines (53 to 56) to be selected in accordance with a signal level to be outputted to the output terminal 62, and outputs the control signals S10, S11 in accordance with the determination result to control the selecting operations of the signal line selecting means 51, 52.

Figure 6:
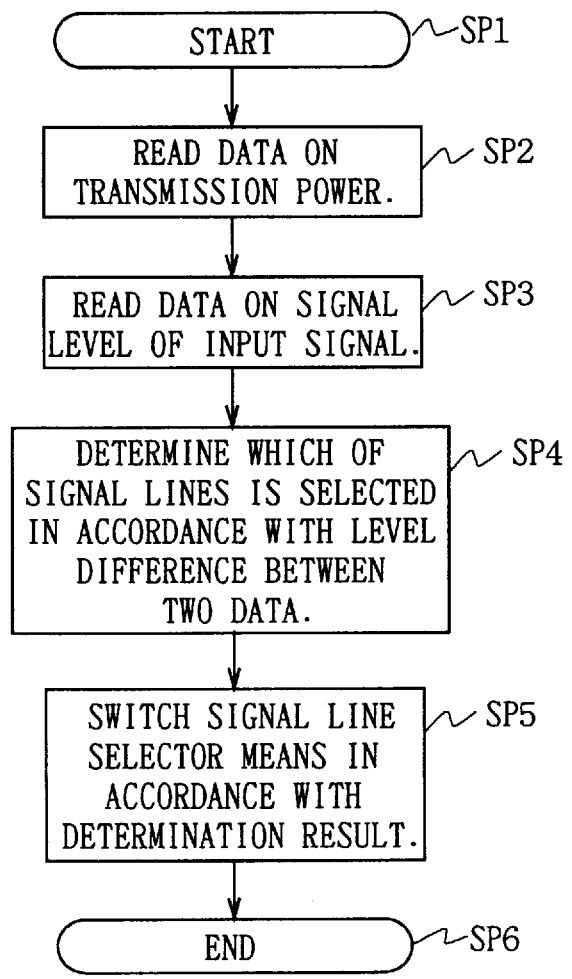
FIG. 6 is a flow chart showing a control procedure of a signal line control means in the gain varying means.

More specifically, in this event, the signal line control means 57 executes a control procedure as illustrated in FIG. 6. The control procedure first begins at step SP1, and the control means 57 reads data on transmission power as a signal level to be outputted to the output terminal 62 at step SP2. Next, at step SP3, the control means 57 reads data on signal level of an input signal supplied to the input terminal 58. Next, at step SP4, the control means 57 calculates a level difference between the two read data, and determines which signal line to be selected in accordance with the calculated level difference. Next, at step SP5, the control means 57 outputs the control signals S10, S11 in accordance with the determination result, thereby switching the selecting operations of the signal line selecting means 51, 52 to select an optimal signal line. After completing this processing, the signal line control means 57 proceeds to step SP6 to terminate the processing.

In this way, the gain varying means 50 switches the signal lines 53 to 56 in accordance with a signal level to be outputted to the output terminal 62 to perform the gain adjustment for the whole transmitter circuit. In this event, since the signal amplifying means 64 to 67 have fixed gain values, the gain varying means 50 performs discrete gain adjustment. However, the gain varying means 50 can maintain optimized power consumption of the respective signal amplifying means 64 to 67 in accordance with the respective gain values and can also turn off signal amplifying means arranged in signal lines not selected, thus making it possible to suppress unnecessary power consumption.

Incidentally, at least one of the plurality of signal lines 53 to 56 may be replaced with a mere transmission path without signal amplifying means, or an attenuator may be inserted instead of a signal amplifying means in at least one of the plurality of signal lines 53 to 56. In this way, a much larger gain difference can be produced. Also, in this case, since attenuators and transmission paths are essentially passive elements and therefore do not consume electric power, unnecessary power consumption can be more suppressed.

Figure 1:
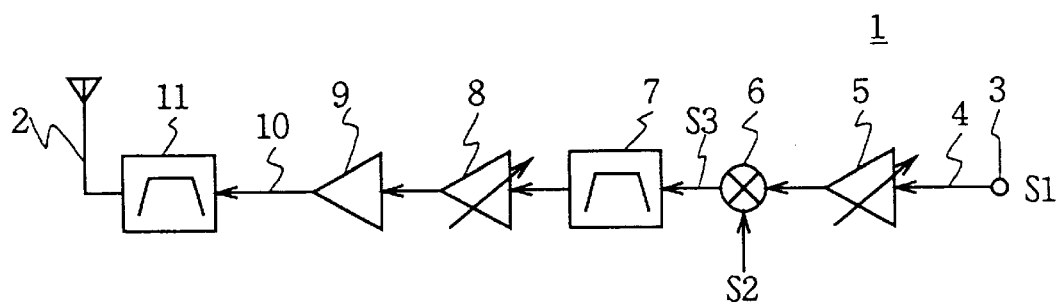
FIG. 1 is a block diagram showing a conventional transmitter circuit.
Figure 7:
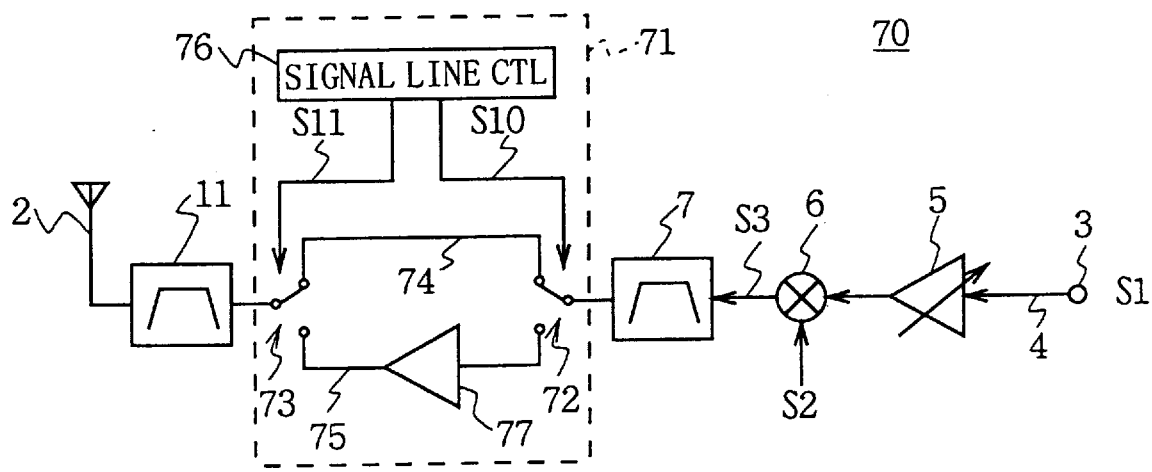
FIG. 7 is a block diagram showing a transmitter circuit according to a first embodiment.

Here, a transmitter circuit practically incorporating the gain varying means 50 as described above is illustrated in FIG. 7 in which parts corresponding to those in FIG. 1 are designated the same reference numerals. In a transmitter circuit 70, a gain varying circuit 71 corresponds to the foregoing gain varying means 50. The gain varying circuit 71 performs gain adjustment in an RF frequency band.

Generally, the gain varying circuit 71 is composed of signal line change-over switches 72, 73; signal lines 74, 75 having different gains which are switched by the signal line change-over switches 72, 73; and a signal line control circuit 76 for controlling switching operations of the signal line change-over switches 72, 73. In other words, the signal line change-over switches 72, 73 correspond to the foregoing signal line selecting means 51, 52, the signal lines 74, 75 correspond to the foregoing signal lines 53 to 56, and the signal line control circuit 76 corresponds to the foregoing signal line control means 57.

In case of the gain varying circuit 71, the signal line 74, one of the two signal lines, is formed of a transmission path without amplifier, while the other signal line 75 is provided with an amplifier 77 for amplifying electric power, for example, by 20 [dB]. Incidentally, electric power consumed by the amplifier 77 arranged in the signal line 75 is optimized in accordance with the gain value.

The signal line control circuit 76 outputs control signals S10, S11 to switch the signal line change-over switches 72, 73, thus selecting one of the two signal lines 74, 75. In this event, the signal line control circuit 76 examines a necessary signal level at a transmission antenna end to determine whether or not an RF signal S3 requires power amplification. The signal line control circuit 76 selects the signal line 75 when the power amplification is required, and selects the signal line 74 when no power amplification is required. For reference, when the signal line 74 is selected, the amplifier 77 is turned off by the signal line control circuit 76.

In this way, the gain varying circuit 71 switches the signal lines (74, 75) to perform the gain adjustment. In this event, the gain varying circuit 71 may take two gain conditions: one is a 0 [dB] condition when the signal line 74 is selected, and the other is a 20 [dB] condition when the signal line 75 is selected. As is apparent from this, the gain adjustment at the RF stage is discrete. However, in the transmitter circuit 70, since the IF stage is provided with a variable gain amplifier 5 capable of continuous gain adjustment, the continuous gain adjustment is performed by the variable gain amplifier 5 to compensate for the discrete gain adjustment at the RF stage. In other words, the transmitter circuit 70 produces a finally desired gain by the two elements: the gain varying circuit 71 performing discrete gain adjustment and the variable gain amplifier 5 performing continuous gain adjustment.

Figure 8:
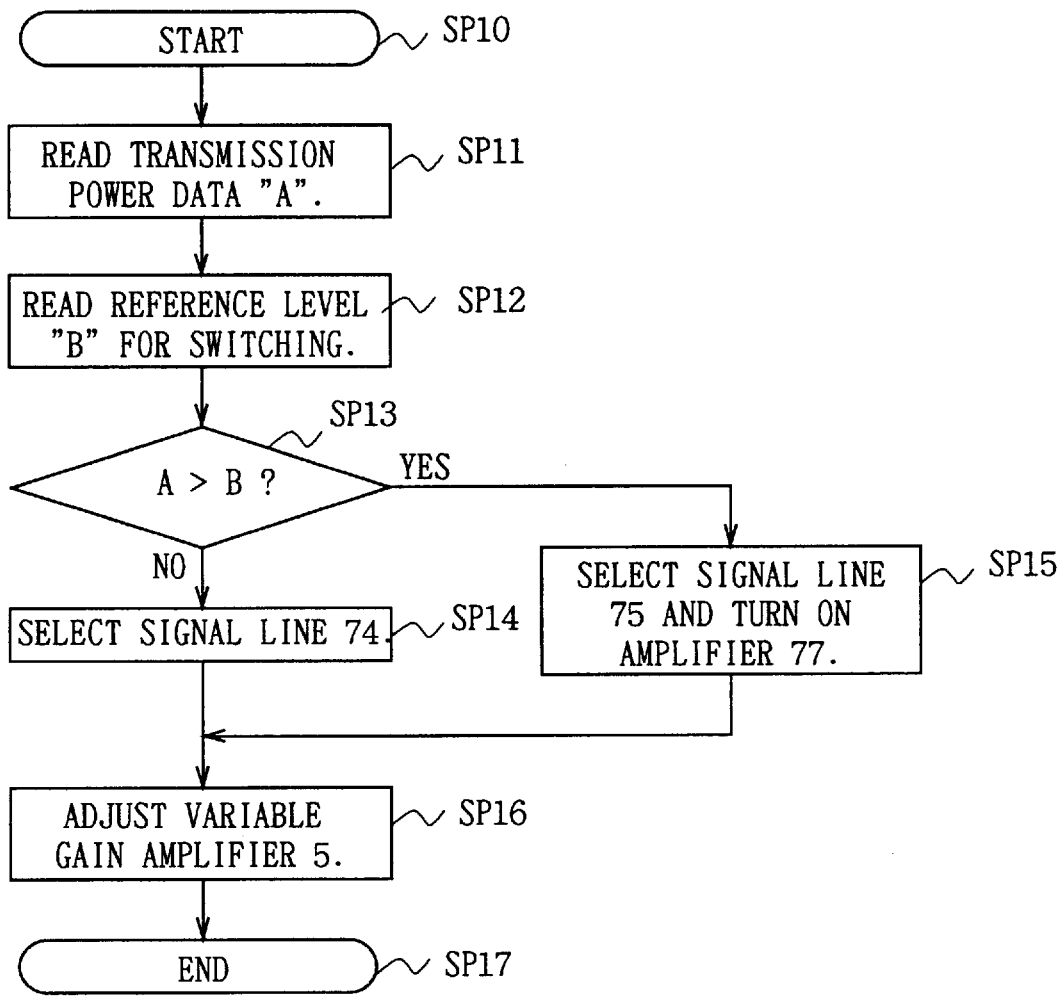
FIG. 8 is a flow chart showing a control procedure of a signal line control circuit according to the first embodiment.

Now, a control procedure of the signal line control circuit 76 will be specifically described with reference to a flow chart illustrated in FIG. 8. First, the control procedure begins with step SP10, and at step SP11, the control circuit 76 reads transmission power data "A" as information on a required signal level at a transmission antenna end. Next, at step SP12, the control circuit 76 reads a reference level "B" for switching the signal lines. In this event, the reference level is read instead of the signal level of an RF signal S3 because there are only two signal lines to be switched, so that it becomes necessarily aware which of the signal lines should be selected only by determining whether or not required transmission power exceeds the reference level.

Next, at step SP13, the read transmission power data "A" is compared with the reference level "B". As a result, the control procedure proceeds to step SP14 when the transmission power data "A" is not larger, while the control procedure proceeds to step SP15 when the transmission power data "A" is larger.

At step SP14, the signal line control circuit 76 controls the signal line change-over switches 72, 73 to select the signal line 74 formed of a mere transmission path. On the other hand, at step SP15, the signal line control circuit 76 controls the signal line change-over switches 72, 73 to select the signal line 75 having a predetermined gain and turns on the amplifier 77 which produces the gain.

After completing the processing at step SP14 or at step SP15, the control procedure proceeds to subsequent step SP16, where the gain of the variable gain amplifier 5 is adjusted to adjust the gain of the whole transmitter circuit 70. This causes the transmission antenna 2 to be supplied with an RF signal S3 which has been amplified to desired power. In other words, a signal level required at the transmission antenna end is satisfied. After completing the processing at step SP16, the control procedure proceeds to step SP17 to terminate the processing.

With the foregoing configuration, in the case of the gain varying circuit 71, the gain adjustment is carried out by switching the two signal lines 74, 75 having different gains arranged. Specifically, a signal level required at the transmission antenna end is examined, and the signal line 75 having the amplifier 77 is selected when power amplification is required, while the signal line 74 formed of a mere transmission path without amplifier is selected when no power amplification is required. In this event, the amplifier 77 is operated only when the signal line 75 is selected. Thus, the amplifier need not be always operated as before, making it possible to suppress unnecessary power consumption. Therefore, by using the transmitter circuit 70 which adjusts the gain by the gain varying circuit 71 as described above, a battery life for a mobile terminal can be extended, and hence a communication available time can be made longer.

Incidentally, since the gain varying circuit 71 performs the gain adjustment by switching the two signal lines 74, 75 having different gains, the resulting gain adjustment is discrete. For this reason, the transmitter circuit 70 utilizes the variable gain amplifier 5 arranged at the IF stage to compensate for a discrete gain change to provide a desired gain change as a whole. By thus performing the gain adjustment with both of the gain varying circuit 71 and the variable gain amplifier 5, the dynamic range of each element can be reduced also in the transmitter circuit 70.

Further, the power amplifier at the RF stage tends to make the power adding efficiency worse when the low level signal is input. Even if the gain adjustment is performed by the gain varying amplifier at the IF stage, power may be wastefully consumed by the power amplifier at the RF stage. However, in this embodiment, the amplifier 77 is operated only when necessary, so as to diminish the wasteful power consumption.

According to the foregoing configuration, the gain adjustment is carried out by switching the signal line 74 formed of a mere transmission path without amplifier and the signal line 75 having the amplifier 77, and the amplifier 77 is operated only when the signal line 75 is selected, so that the amplifier need not be always operated as before, thus making it possible to suppress unnecessary power consumption.

(1-2) Second Embodiment

Figure 2:
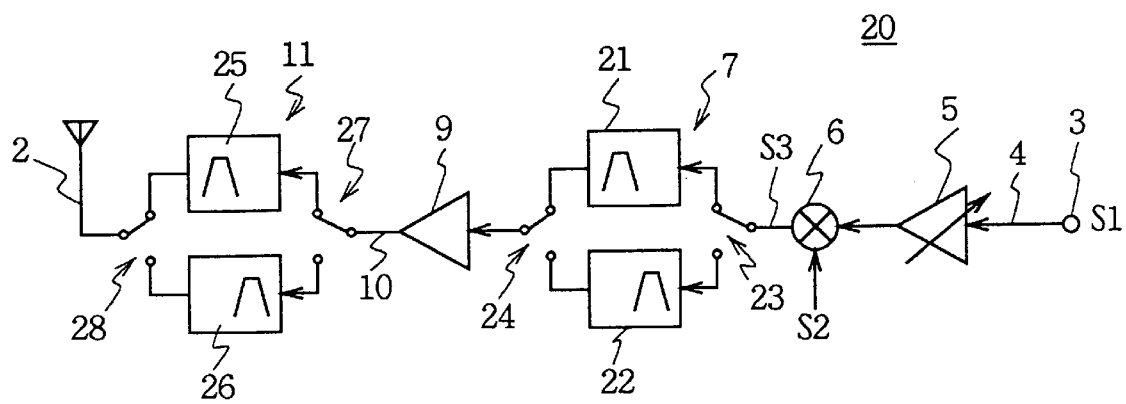
FIG. 2 is a block diagram showing a conventional transmitter circuit which has a bandpass filter divided into portions.
Figure 9:
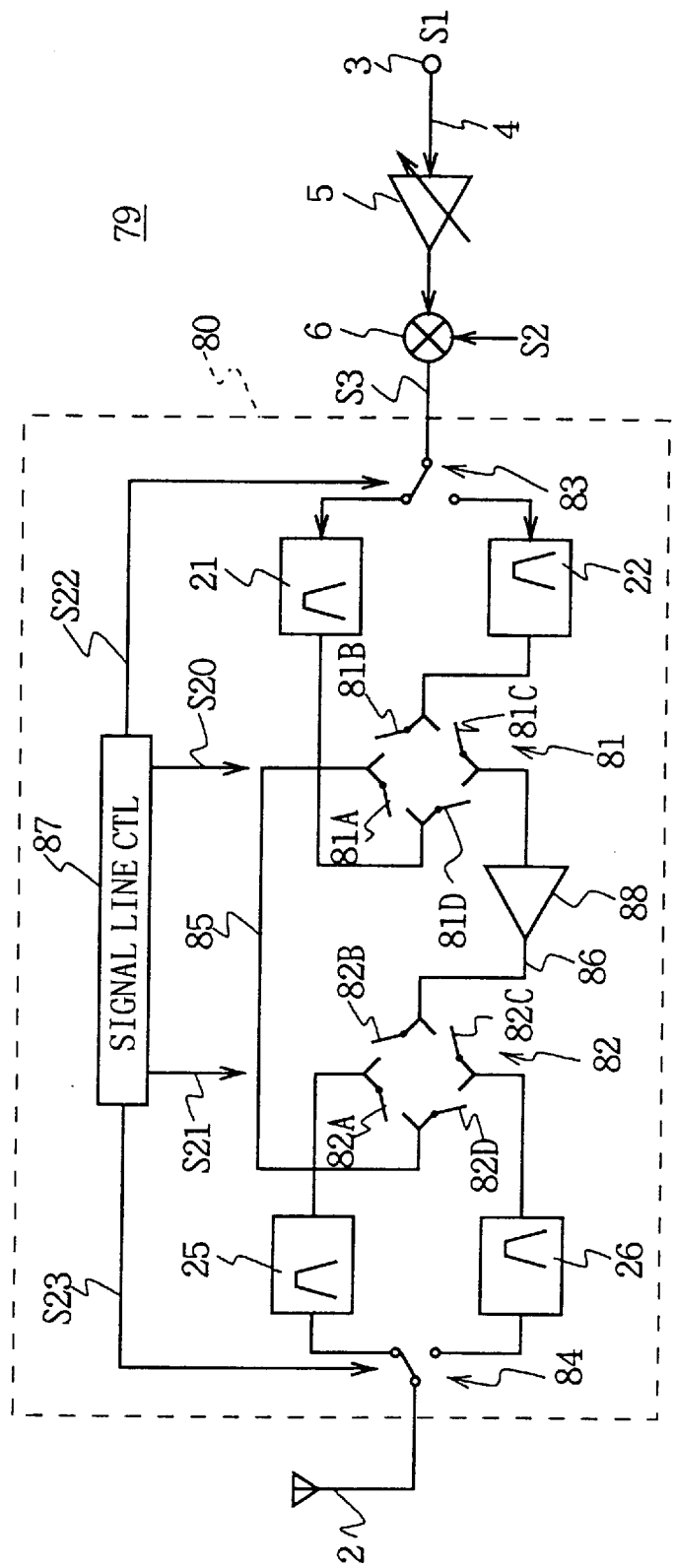
FIG. 9 is a block diagram showing a transmitter circuit according to a second embodiment.

FIG. 9 shows a transmitter circuit 79 according to a second embodiment, where parts corresponding to those in FIG. 2 are designated with the same reference numerals. While the foregoing first embodiment has been described for the case where the gain is merely switched by the gain varying circuit 71, this embodiment switches a bandpass filter as well as the gain by a gain varying circuit.

Generally, a gain varying circuit 80 is composed of signal line change-over switches 81, 82 and 83, 84; two signal lines 85, 86 having different gains; bandpass filters 21, 22 and 25, 26 having different pass bands; and a signal line control circuit 87 for controlling switching operations of the signal line change-over switches 81, 82 and 83, 84.

The signal line change-over switch 81 comprises a circular switch composed of four switches 81A to 81D connected in a circular shape, wherein two opposite ones of four connection cross-points are used as input terminals and the remaining two are used as output terminals, so that an input terminal and an output terminal can be connected by a single switch. In this case, the two input terminals are connected to the bandpass filters 21, 22, respectively, while the two output terminals are connected to the signal lines 85, 86, respectively. Thus, the signal line change-over switch 81 switches connection between the bandpass filters 21, 22 and the signal lines 85, 86.

Likewise, the signal line change-over switch 82 also comprises a circular switch composed of four switches 82A to 82D connected in a circular shape, wherein two opposite ones of four connection cross-points are used as input terminals and the remaining two are used as output terminals, so that an input terminal and an output terminal can be connected by a single switch. In this case, the two input terminals are connected to the signal lines 85, 86, respectively, while the two output terminals are connected to the bandpass filters 25, 26, respectively. Thus, the signal line change-over switch 82 switches connection between the signal lines 85, 86 and the bandpass filters 25, 26.

The signal line change-over switch 83 in turn is a switch for switching filters to be applied to an RF signal S3, and connects one of the bandpass filters 21, 22 to a frequency mixer 6. Also, the signal line change-over switch 84 is a switch for supplying a transmission antenna 2 with the RF signal S3 bandwidth limited by the bandpass filter 25 or the bandpass filter 26, and connects one of the bandpass filters 25, 26 to the transmission antenna 2.

Also in this embodiment, the signal line 85, one of the two signal lines, is formed of a mere transmission path without amplifier, while the other signal line 86 is configured to perform power amplification of, for example, 20 [dB] by an amplifier 88. Incidentally, also in this embodiment, the power consumption of the amplifier 88 arranged in the signal line 86 is optimized in accordance with the gain value.

The bandpass filters 21, 22 are filters having different pass bands from each other so that the two filters cover the whole bandwidth of the RF signal S3. Similarly, the bandpass filters 25, 26 are filters having different pass bands from each other so that the two filters cover the whole bandwidth of the RF signal S3. By thus dividing the pass band, a smaller volume and smaller loss bandpass filter is realized also in the transmitter circuit 79.

The signal line control circuit 87 outputs control signals S20, S21 to switch the signal line change-over switches 81, 82, and also outputs control signals S22, S23 to switch the signal line change-over switches 83, 84. In this event, the signal line control circuit 87 examines a signal level required at a transmission antenna end to determine whether or not an RF signal S3 requires power amplification. The signal line control circuit 87 selects the signal line 86 when power amplification is required and selects the signal line 85 when no power amplification is required. For reference, when the signal line 85 is selected, the amplifier 88 is turned off by the signal line control circuit 87.

Also, the signal line control circuit 87 examines the frequency used by the RF signal S3 to determine which of the bandpass filters should be selected, and switches the signal line change-over switches 81 to 84 based on the determination result.

Incidentally, also in this embodiment, since the gain adjustment is performed by selecting a signal line (85, 86), the resulting gain adjustment is discrete at the RF stage. For this reason, in the transmitter circuit 79, a variable gain amplifier 5 at the IF stage continuously adjusts the gain to compensate for the discrete gain adjustment at the RF stage.

Figure 10:
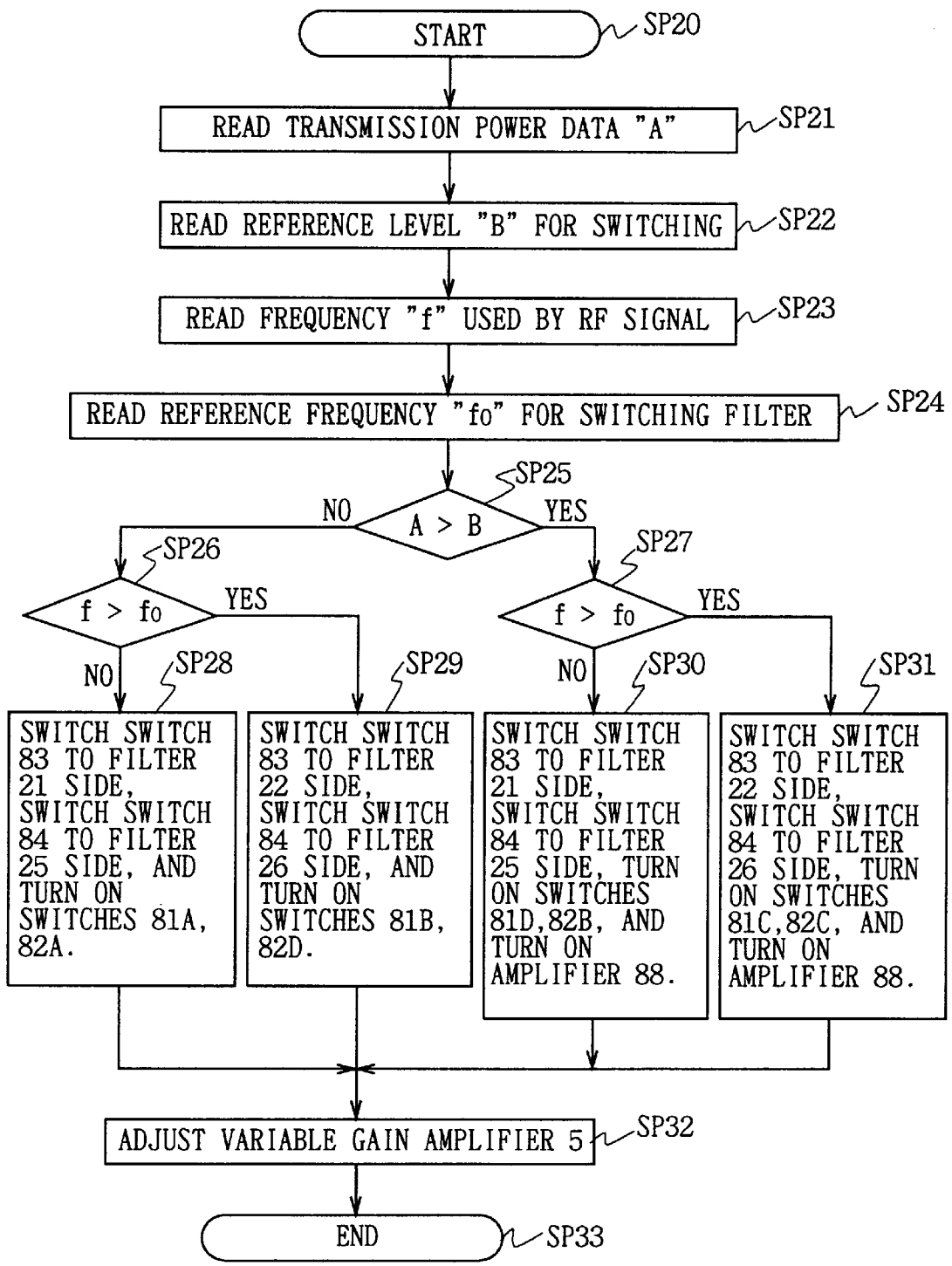
FIG. 10 is a flow chart showing a control procedure of a signal line control circuit according to the second embodiment.

Now, a control procedure of the signal line control circuit 87 will be specifically described with reference to a flow chart of FIG. 10. First, the control procedure begins with step SP20, and at step SP21, the control circuit 87 reads transmission power data "A" as information on a signal level required at the transmission antenna end, and reads a reference level "B" for switching the signal lines at next step SP22. Next, the control circuit 87 reads a frequency "f" used by an RF signal S3 at step SP23, and reads a reference frequency "$f_0$" for switching bandpass filters at next step SP24.

At next step SP25, the read transmission power data "A" is compared with the reference level "B". As a result, the control procedure proceeds to step SP26 when the transmission power data "A" is not larger, and proceeds to step SP27 when the transmission power data "A" is larger.

At step SP26, the read used frequency "f" is compared with the reference frequency "$f_0$". As a result, the control procedure proceeds to step SP28 when the used frequency "f" is lower, and proceeds to step SP29 when the used frequency "f" is higher.

When the control procedure proceeds to step SP28, the signal line control circuit 87 switches the signal line change-over switch 83 to the bandpass filter 21 side, switches the signal line change-over switch 84 to the bandpass filter 25 side, and turns on the switch 81A of the signal line change-over switch 81 and the switch 82A of the signal line change-over switch 82. In this way, the RF signal S3 is supplied to the transmission antenna 2 through the bandpass filter 21, the signal line 85, and the bandpass filter 25 in order.

On the other hand, when the control procedure proceeds to step SP29, the signal line control circuit 87 switches the signal line change-over switch 83 to the bandpass filter 22 side, switches the signal line change-over switch 84 to the bandpass filter 26 side, and turns on the switch 81B of the signal line change-over switch 81 and the switch 82D of the signal line change-over switch 82. In this way, the RF signal S3 is supplied to the transmission antenna 2 through the bandpass filter 22, the signal line 85, and the bandpass filter 26 in order.

When the control procedure proceeds to step SP27, the read used frequency "f" is compared with the reference frequency "$f_0$" in a similar manner. As a result, the control procedure proceeds to step SP30 when the used frequency "f" is lower, and proceeds to step SP31 when the used frequency "f" is higher.

When the control procedure proceeds to step SP30, the signal line control circuit 87 switches the signal line change-over switch 83 to the bandpass filter 21 side, switches the signal line change-over switch 84 to the bandpass filter 25 side, turns on the switch 81D of the signal line change-over switch 81 and the switch 82B of the signal line change-over switch 82, and turns on the amplifier 88. In this way, the RF signal S3 is supplied to the transmission antenna 2 through the bandpass filter 21, the signal line 86, and the bandpass filter 25 in order.

On the other hand, when the control procedure proceeds to step SP31, the signal line control circuit 87 switches the signal line change-over switch 83 to the bandpass filter 22 side, switches the signal line change-over switch 84 to the bandpass filter 26 side, turns on the switch 81C of the signal line change-over switch 81 and the switch 82C of the signal line change-over switch 82, and turns on the amplifier 88. In this way, the RF signal S3 is supplied to the transmission antenna 2 through the bandpass filter 22, the signal line 86, and the bandpass filter 26 in order.

After completing the processing at step SP28, SP29, SP30 or SP31 as described above, the control procedure proceeds to next step SP32, where the gain of the variable gain amplifier 5 is adjusted to coordinate the gain of the whole transmitter circuit 79. After completing the processing at step SP32, the control procedure proceeds to step SP33 to terminate the processing.

With the foregoing configuration, in this embodiment, the bandpass filter is switched together with the gain adjustment performed by the gain varying circuit 80. In this event, the signal line control circuit 87 controls switching states of the signal line change-over switches 81 to 84 in the gain varying circuit 80 to simultaneously perform the gain adjustment and the switching of the bandpass filter.

Incidentally, in this embodiment, the connection between one of the two signal lines having different pass band characteristics (i.e., the signal line having the bandpass filter 21 and the signal line having the bandpass filter 22) and one of the two signal lines 85, 86 having different gains is switched by the signal line change-over switch 81 comprising a circular switch.

When the connection is switched by the signal line change-over switch 81 comprising a circular switch as mentioned above, insertion loss occurring in the signal line change-over switch 81 can be reduced. This is because, in the circular switch, the signal line is switched by turning on one of the four switches 81A to 81D, so that only one switch is inserted in the signal line. Generally, for switching the connection between one of two lines on the input side and one of two lines on the output side, it is often the case that the switching is carried out by a combination of two switches. In this case, however, two switches are inserted in a signal line, resulting in larger insertion loss. On the other hand, when a circular switch is used as is the case of this embodiment, only one switch is inserted in a signal line, so that insertion loss can be reduced.

Also in this embodiment, the connection between one of the two signal lines 85, 86 having different gains and the two signal lines having different pass band characteristics (i.e., the signal line having the bandpass filter 25 and the signal line having the bandpass filter 26) is switched by the signal line change-over switch 82 comprising a circular switch. By a similar reason, insertion loss can be reduced also in this portion.

Incidentally, also in this embodiment, since the amplifier 88 is operated only when the signal line 86 is selected, useless power consumption can be suppressed. In addition, the whole gain adjustment is performed by both of the gain varying circuit 80 and the variable gain amplifier 5, the dynamic range of each element can be reduced.

According to the foregoing configuration, since the signal line change-over switches 81, 82 each comprising a circular switch are used for switching the signal lines, the connection between one of the signal lines having different pass band characteristics and the signal lines 85, 86 having different gains can be simultaneously switched with lower insertion loss.

(1-3) Third Embodiment

Figure 11:
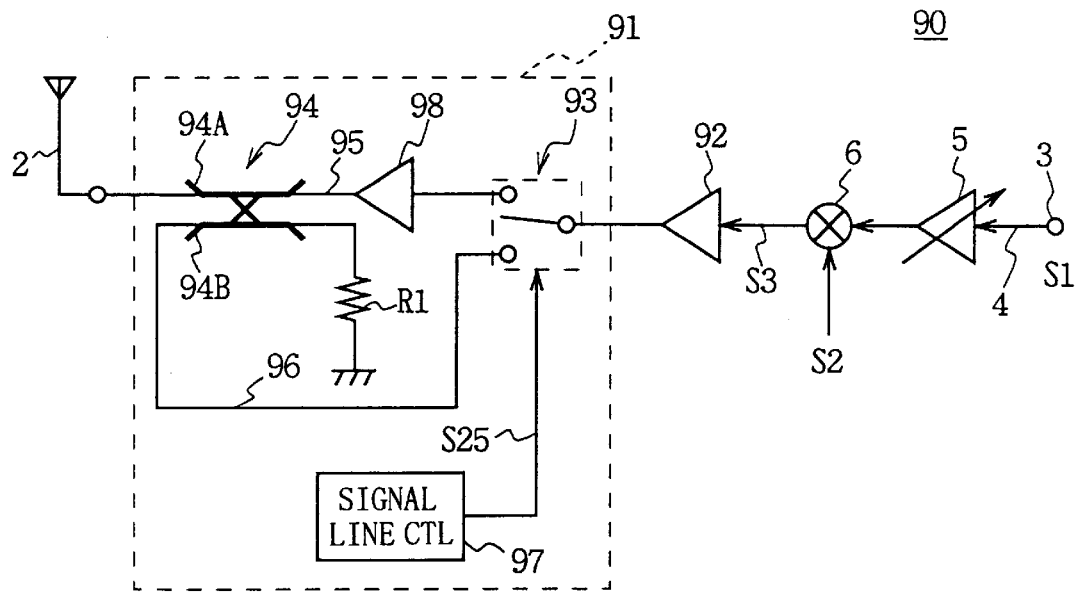
FIG. 11 is a block diagram showing a transmitter circuit according to a third embodiment.

In FIG. 11, the numeral 90 shows a transmitter circuit according to a third embodiment as a whole. In the case of the transmitter circuit 90, a gain varying circuit 91 is used for suppressing the unnecessary power consumption and performing gain adjustment.

First, an IF signal S1 having a constant level, fed from an input terminal 3, is inputted through an IF signal line 4 to a variable gain amplifier 5 in which the IF signal S1 is adjusted for the gain by a width of 50 [dB]. In the variable gain amplifier 5, for example, a digital gain control signal output from specific control means is converted into an analog signal to be supplied, so that it is controlled to a desired gain value.

The IF signal S1 which is gain-adjusted to a desired value by the variable gain amplifier 5 is next inputted to a frequency mixer 6 where the IF signal S1 is subjected to a frequency conversion using a local signal S2 to be converted into an RF signal S3 having a high frequency. The RF signal S3, after passing through a RF driver circuit 92 for performing a predetermined signal processing, is inputted to a gain varying circuit 91. The RF driver circuit 92 is composed of a bandpass filter, buffer amplifier, and so on, and removes unnecessary frequency components from the RF signal S3 which is frequency-converted by the frequency mixer 6. The RF driver circuit 92 further performs the impedance adjustment, etc. when the RF signal S3 is supplied to the gain varying circuit 91.

The gain varying circuit 91 allows the RF signal S3 to pass through the signal line having a specific gain value if the RF signal S3 is needed to be amplified, and to pass through merely a transmission path if the RF signal S3 is not needed to be amplified. Thereby, the RF signal S3 is adjusted for the gain to the desired signal level required at an antenna end. The RF signal S3 adjusted for the gain as described above is finally supplied to a transmission antenna 2 to be radiated.

Generally, the gain varying circuit 91 is composed of signal line change-over switches 93, 94; signal lines 95, 96 having different gains which are switched by the signal line change-over switches 93, 94; and a signal line control circuit 97 for controlling switching operations of the signal line change-over switch 93.

In the case of the gain varying circuit 91, one signal line 96 of two signal lines is formed by a mere transmission path without amplifier, while the other signal line 95 is so configured as to perform power amplification of, e.g., 10 [dB] by an amplifier (PA) 98. In addition, the power consumption of the amplifier 98 provided at the signal line 95 is optimized in accordance with the gain value.

The signal line change-over switch 93 comprises a switch formed by a semiconductor switch, in which the RF driver circuit 92 is connected to the input terminal and the signal lines 95, 96 are connected to two output terminals respectively. The signal line change-over switch 93 switches the passing route of the RF signal S3 to one of two signal lines 95, 96.

On the other hand, the signal line change-over switch 94 is a switch formed by a directional coupler composed of parallel two lines (94A, 94B), and outputs the RF signal S3 passed through the signal line 95 or the signal line 96 to the transmission antenna 2. More specifically, in the signal line change-over switch 94, the signal line 95 is connected to one end of a first line 94A, while the transmission antenna 2 is connected to the other end, so that the RF signal S3 passed through the signal line 95 is supplied to the transmission antenna 2 through the first line 94A. Also, the signal line 96 is connected to one end of a second line 94B, while a resistance R1 having the same value as the characteristic impedance of the second line 94B is connected to the other end, so that the RF signal S3 passed through the signal line 96 is picked up by the first line 94A by the inter-lines coupling of the parallel two lines to be supplied to the transmission antenna 2.

The signal line control circuit 97 outputs a control signal S25 to the signal line change-over switch 93 to control the connection relationship of the signal line change-over switch 93 in accordance with the signal level required at the transmission antenna end. More specifically, the signal line control circuit 97 examines a necessary signal level at the transmission antenna end to determine whether or not the RF signal S3 requires power amplification. The signal line control circuit 97 switches the signal line change-over switch 93 to the signal line 95 when the power amplification is required, and switches the signal line change-over switch 93 to the signal line 96 when no power amplification is required. For reference, when the signal line 96 is selected because no power amplification is required, the amplifier 98 provided at the signal line 95 is turned off by the signal line control circuit 97.

Figure 12:
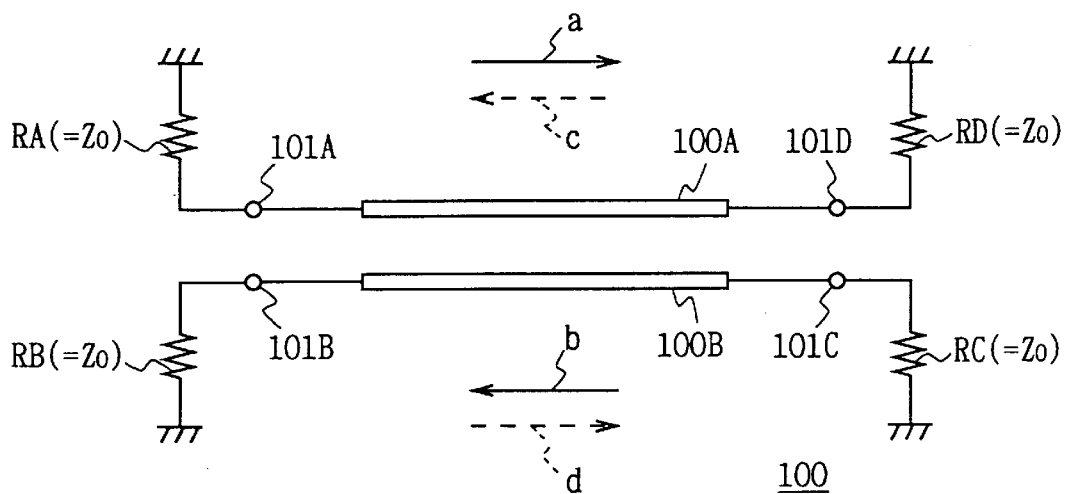
FIG. 12 is a block diagram explaining the operation of a directional coupler.

Here, a directional coupler forming the signal line change-over switch 94 will be described with reference to FIG. 12. As shown in FIG. 12, the directional coupler 100 is generally formed with two parallel lines (100A, 100B), which realizes basic operation by respectively connecting loads RA to RD of the same impedance as the characteristic impedance ($Z_0$) of the lines 100A, 100B to the four terminals (101A to 101D).

For example, when a traveling wave "a" is passed through the line 100A, a signal wave "b" appears at the line 100B in the opposite direction with respect to the traveling wave "a" by the inter-lines coupling of two parallel lines. At this time, the signal level of the signal wave "b" is the signal level depending on the coupling loss of the two parallel lines. On the contrary, when a traveling wave "b" is passed through the line 100B, a signal wave "a" similarly appears at the line 100A in the opposite direction with respect to the traveling wave "b" by the inter-lines coupling.

For reference, if the loads RA to RD connected to the line 100A or line 100B do not coincide with the characteristic impedance of the line, reflected wave is generated at the line end due to the impedance mismatching, and the reflected wave also appears at the other line by the inter-lines coupling. For example, when the load RD of the impedance which is different from the characteristic impedance $Z_0$ is connected to the terminal 101D, the reflected wave "c" of the traveling wave "a" appears at the line 100A, and in this case, the signal wave "d" in the opposite direction, with the signal level depending on the coupling loss, also appears at the line 100B by the inter-lines coupling.

In this way, the directional coupler 100 is a passive element having the directionality of four terminals and has the reversible relationship between respective terminals.

The gain varying circuit 91 according to this embodiment uses such directional coupler 100 to form the signal line change-over switch 94, so as to output the RF signal S3 passed through the signal line 95 or the signal line 96 to the transmission antenna 2.

With the foregoing configuration, in the case of the gain varying circuit 91, the gain adjustment is carried out by switching the two signal lines 95, 96 having different gains arranged. Specifically, a signal level required at the transmission antenna end is examined, and the signal line 95 having the amplifier 98 is selected when power amplification is required, while the signal line 96 formed of a mere transmission path without amplifier is selected when no power amplification is required. In this event, the amplifier 98 is operated only when the signal line 95 is selected. Thus, the amplifier need not be always operated as before, making it possible to suppress unnecessary power consumption. Therefore, by using the transmitter circuit 90 which adjusts the gain by the gain varying circuit 91 as described above, a battery life for a mobile terminal can be extended, and hence a communication available time can be made longer.

Incidentally, since the gain varying circuit 91 performs the gain adjustment by switching the two signal lines 95, 96 having different gains, the resulting gain adjustment is discrete. For this reason, the transmitter circuit 90 utilizes the variable gain amplifier 5 arranged at the IF stage to compensate for a discrete gain change to provide a desired gain change as a whole. By thus performing the gain adjustment with both of the gain varying circuit 91 and the variable gain amplifier 5, the dynamic range of each element can be reduced also in the transmitter circuit 90.

Figure 13:
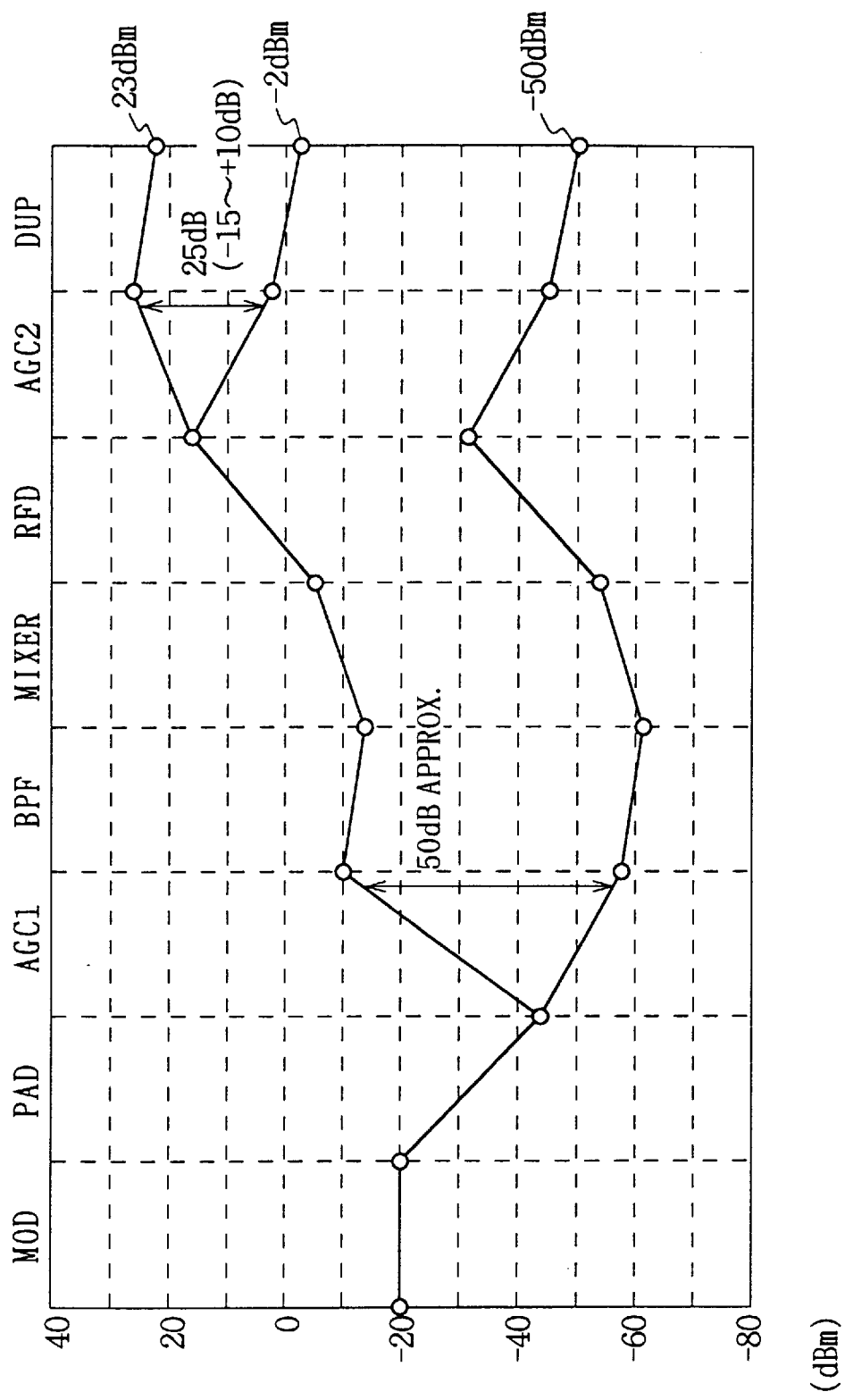
FIG. 13 is a characteristic curve diagram showing an example of a dynamic range of the transmitter circuit according to the third embodiment.
Figure 14:
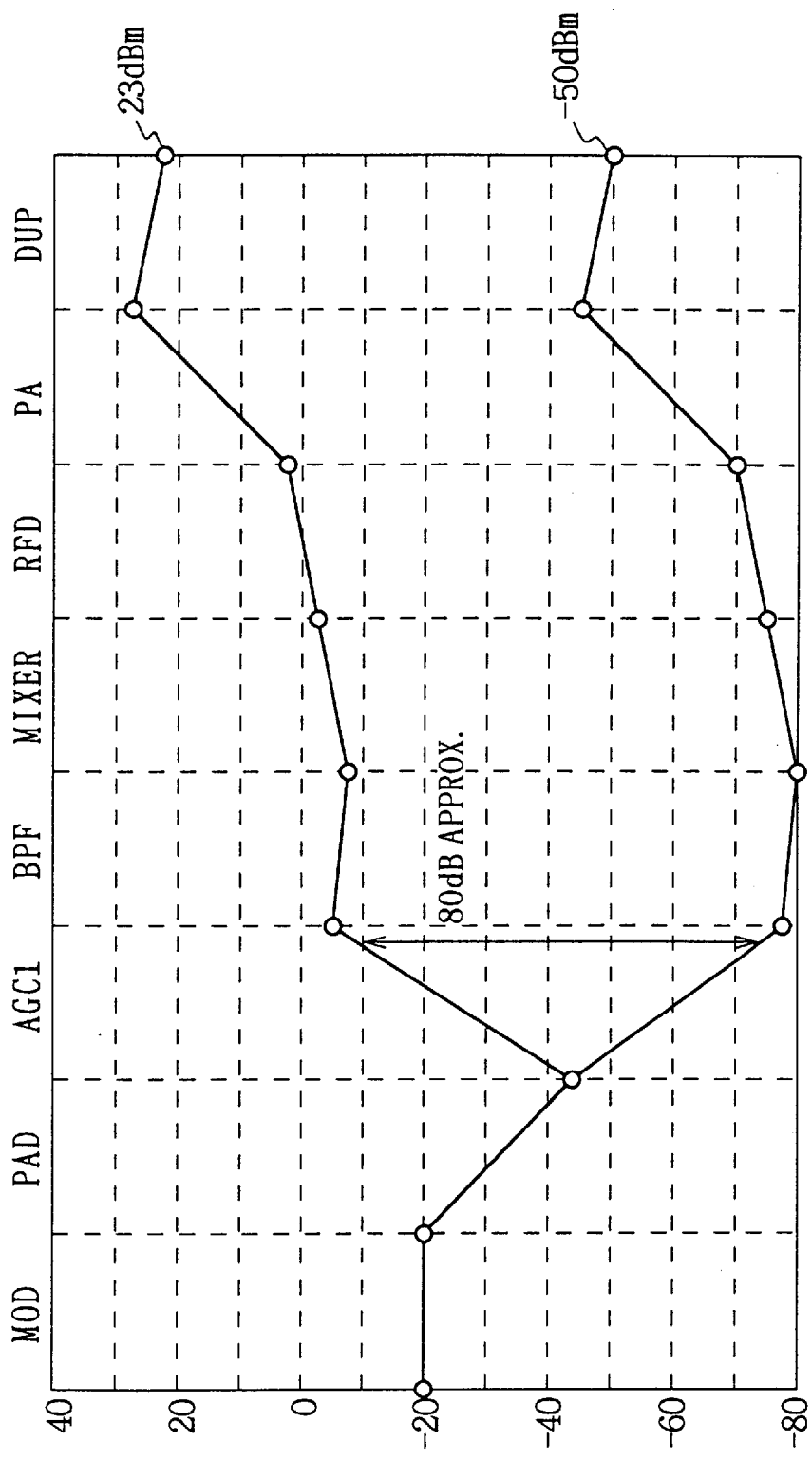
FIG. 14 is a characteristic curve diagram showing an example of a dynamic range in the conventional case used for explaining the comparison of dynamic range.
Figure 15:
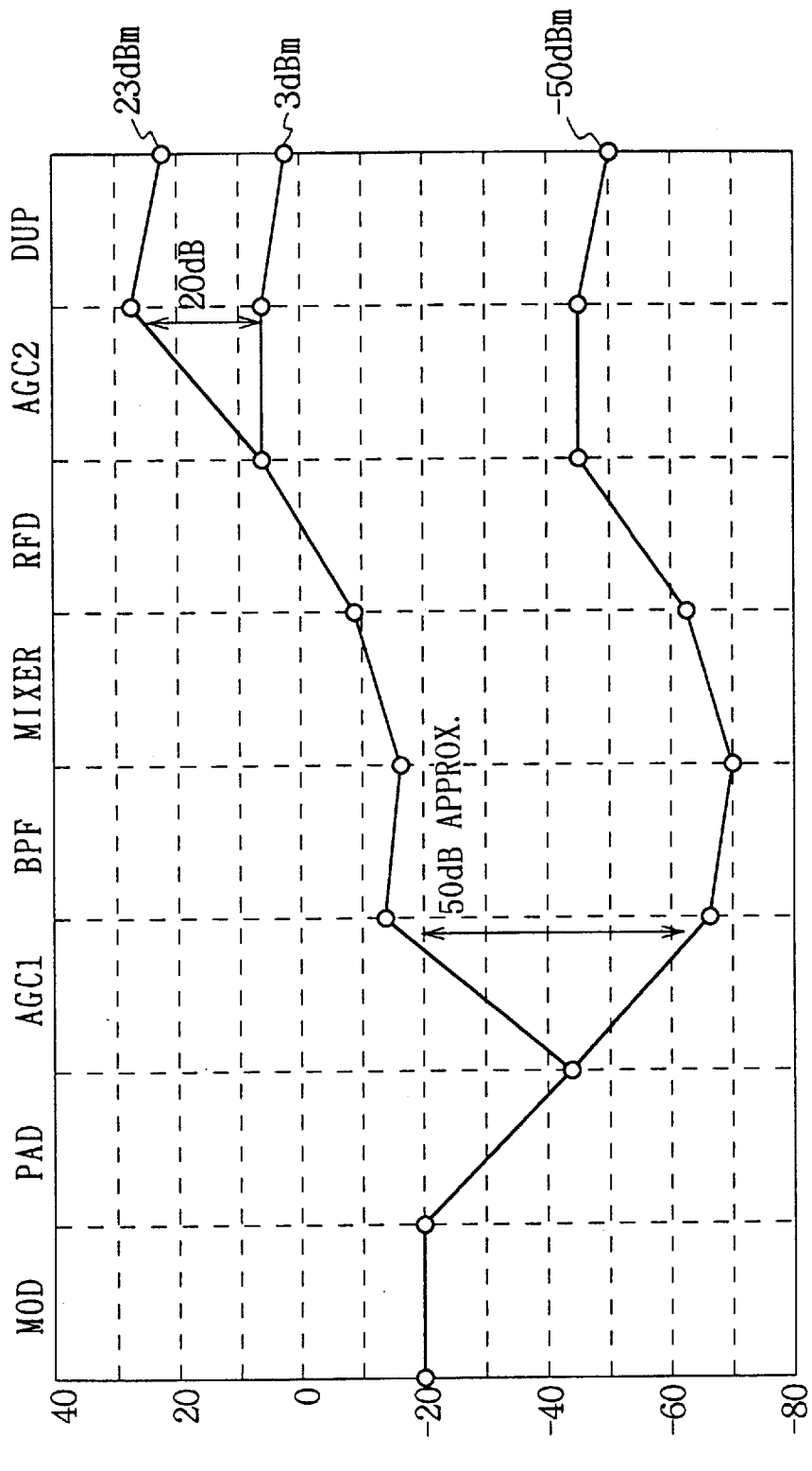
FIG. 15 is a characteristic curve diagram showing an example of a dynamic range in the first embodiment used for explaining the comparison of dynamic range.

FIG. 13 shows an example of the dynamic range in the case where a mobile terminal is constructed by the transmitter circuit 90 as described above. For reference, FIG. 14 shows an example of the dynamic range in the case where the gain adjustment is performed by a single variable gain amplifier as a conventional 29 one, and FIG. 15 shows an example of the dynamic range in the case where the gain adjustment is performed by both of the gain varying circuit 71 and the variable gain amplifier 5 as the first embodiment. Note that, in the figure, "MOD" denotes a modulator, "PAD" denotes an attenuator, "AGC1" denotes a variable gain amplifier, "BPF" denotes a bandpass filter, "MIXER" denotes a frequency mixer, "RFD" denotes a RF driver circuit, "PA" denotes an amplifier, "DUP" denotes a duplexer circuit, and "AGC2" denotes a gain varying circuit, respectively.

As shown in FIG. 13, in the case where the gain adjustment is performed with the width of 50 [dB] in the variable gain amplifier AGC1 at the IF stage and the width of 25 [dB] in the gain varying circuit AGC2 at the RF stage, to divide the gain adjustment into two steps, it is enough that the elements from the variable gain amplifier to the RF driver circuit have the dynamic range of 50 [dB]. On the contrary, as shown in FIG. 14, in the case where the gain adjustment if performed with the width of 80 [dB] in the variable gain amplifier as conventional, the dynamic range of 80 [dB] is required in the elements from the variable gain amplifier to the RF driver circuit. By dividing the gain adjustment in this way, the dynamic range of respective elements can be reduced.

Further, as shown in FIG. 14, in the case where the gain adjustment is performed with the width of 80 [dB] by a conventional variable gain amplifier, an attenuator having a large amount of attenuation is required at a previous stage, so that the level diagram is lowered as a whole. Therefore, in the conventional case, there arises an inconvenience that the out-band signal level becomes high due to the bad noise factor. However, as shown in FIG. 13, if the gain assignment is divided, the attenuation amount of the attenuator which is provided at a previous stage of the variable gain amplifier, so as to prevent such problem previously.

In addition, as is clear from FIG. 15, also in the first embodiment, the problem in regard to the dynamic range or the out-band signal level has been improved by the same method.

Further, as is known from the comparison of FIG. 13 and FIG. 15, in this embodiment, the coupling loss of the directional coupler causes the level down of about 15 [dB] when the signal is not amplified at the gain varying circuit 91 (that is, when the signal line 96 is selected). However, a problem will not specially arise if it is compensated with the previous circuits.

Further, in this embodiment, a semiconductor switch is not used as the signal line change-over switch 94 at an output side of the gain varying circuit 91, but a directional coupler is used, so as to decrease the insertion loss generated at the signal line change-over switch 94. More specifically, the insertion loss in the case of semiconductor switch is about 0.6 [dB], and the insertion loss in the case of directional coupler is about 0.1 [dB]. The insertion loss can be reduced for the difference between the values (0.5 [dB]= 10% approx.).

Further, in this embodiment, the directional coupler is used as the signal line change-over switch 94, thereby the size of gain varying circuit 91 can be small and the entire size of the transmitter circuit 90 can be reduced. Specifically, a semiconductor switch which is provided at an output side of the amplifier (PA) 98 has a large handling power because of a high electric power of the RF signal S3 passing through. As a result, the inner mask becomes large in making it into an IC and the outward form package is generally 4.0×4.0 mm at present. However, in the case of directional coupler, there is no influence from the signal level of the RF signal S3 and its size is generally 3.2×1.6 mm. For this reason, the directional coupler is used to reduce the size of circuit.

With the above configuration, the gain adjustment is carried out by switching the signal line 96 which is a merely transmission path without an amplifier and the signal line 95 having the amplifier 98, so that the amplifier 98 can be operated only when the signal line 95 is selected. Therefore, it is unnecessary to constantly operate the amplifier as a conventional one, so that the unnecessary power consumption can be suppressed.

Further, the directional coupler is used as the signal line change-over switch 94 provided at the output side of the gain varying circuit 91, so as to decrease the size of the gain varying circuit 91 and reduce the insertion loss.

(1-4) Fourth Embodiment

Figure 16:
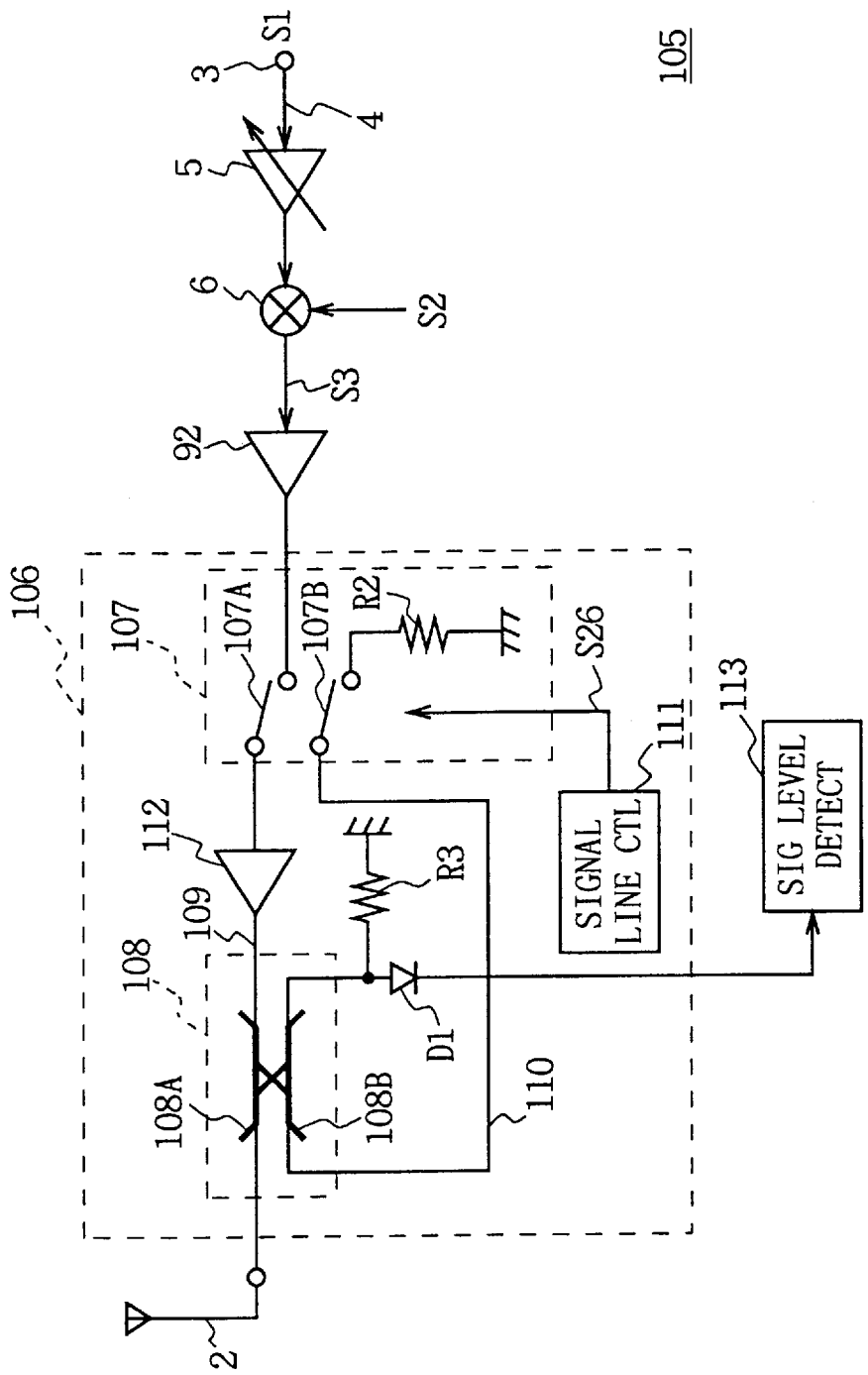
FIG. 16 is a block diagram showing a transmitter circuit according to a fourth embodiment.

In FIG. 16, in which the portions corresponding to those of FIG. 11 are designated with the same symbols, the numeral 105 shows a transmitter circuit as a whole according to the fourth embodiment. In this embodiment, a gain varying circuit 106 is used for switching signal lines each having a different gain and performing gain adjustment of the RF signal S3.

Generally, the gain varying circuit 106 is composed of signal line change-over switches 107, 108; two signal lines 109, 110 having different gains; and a signal line control circuit 111 for controlling switching operations of the signal line change-over switches 107, 108.

In the case of the gain varying circuit 106, one signal line 110 of two signal lines is formed by a mere transmission path without an amplifier, while the other signal line 109 is so configured as to perform power amplification by an amplifier (PA) 112. In addition, the power consumption of the amplifier 112 provided at the signal line 109 is optimized in accordance with the gain value.

The signal line change-over switch 107 is formed by a four-terminals switch in which two semiconductor switches 107A, 107B are combined. One semiconductor switch 107A switches a connection between the signal line 109 and the RF driver circuit 92 and the other semiconductor switch 107B switches a connection between the signal line 110 and the RF driver circuit 92. In addition, the semiconductor switch 107B connects the signal line 110 to a resistance R2 when the signal line 110 is not connected to the RF driver circuit 92.

On the other hand, the signal line change-over switch 108 is formed by a directional coupler composed of two parallel lines (108A, 108B) similar to the third embodiment, and outputs the RF signal S3 passed through the signal line 109 or the signal line 110 to the transmission antenna 2. More specifically, in the signal line change-over switch 108, the signal line 109 is connected to one end of a first line 108A, while the transmission antenna 2 is connected to the other end, so that the RF signal S3 passed through the signal line 109 is supplied to the transmission antenna 2 through the first line 108A. Also, the signal line 110 is connected to one end of a second line 108B, while a resistance R3 having the same value as the characteristic impedance of the second line 108B is connected to the other end, so that the RF signal S3 passed through the signal line 110 is picked up by the first line 108A by the inter-lines coupling of the two parallel lines to be supplied to the transmission antenna 2.

The signal line control circuit 111 outputs a control signal S26 to the signal line change-over switch 107 to control the connection relationship of the signal line change-over switch 107 in accordance with the signal level required at the transmission antenna end. More specifically, the signal line control circuit 111 examines a necessary signal level at the transmission antenna end to determine whether or not the RF signal S3 requires power amplification. The signal line control circuit 111 turns on the semiconductor switch 107A of the signal line change-over switch 107 and switches the semiconductor switch 107B to the resistance R2 side when the power amplification is required, and turns off the semiconductor switch 107A of the signal line change-over switch 107 and switches the semiconductor switch 107B to the RF driver circuit 92 side when no power amplification is required. Therefore, if the power amplification is required, the RF signal S3 output from the RF driver circuit 92, after being amplified through the signal line 109, is supplied to the transmission antenna 2, and if the power amplification is not required, the RF signal S3 is supplied to the transmission antenna 2 through the signal line 110 without amplification. In this way, the gain adjustment is performed. For reference, when the signal line 110 is selected as a passing route of the RF signal S3, the amplifier 112 of the signal line 109 is turned off by the signal line control circuit 111.

The connection cross-points between the second line 108B of the signal line change-over switch 108 and the resistance R3 is connected to a signal level detecting circuit 113 via a diode D1, so that the voltage value of the signal which appears on the second line 108B can be taken in at the signal level detecting circuit 113. The signal level detecting circuit 113 is a circuit for detecting the signal level of the RF signal S3 supplied from the transmission antenna 2, and detects the signal level of the RF signal S3 based on the voltage value of a signal which appears at the second line 108B.

For instance, when the RF signal S3 is supplied to the transmission antenna 2 passed through the signal line 109, a signal which is depending on the RF signal S3 appears at the line 108B by the inter-lines coupling of the directional coupler. The signal level detecting circuit 113 examines the voltage value of the signal so as to detect the signal level of the RF signal S3 which is passed through the signal line 109 and is supplied to the transmission antenna 2. In addition, the other end of the line 108B is connected to the resistance R2 having the same value as the characteristic impedance of the line 108B via the semiconductor switch 107B, so that the line 108B is subjected to the impedance matching. Therefore, the line 108B can pick up a signal with a stable condition. When signal components reflected at the transmission antenna 2 is picked up at the line 108B, the resistance R2 connected to the line 108B absorbs the signal components and detects the level only of the signal irradiated from the transmission antenna 2.

Further, when the RF signal S3 is supplied to the transmission antenna 2 passed through the line 110, since the RF signal S3 passes through the line 108B, the RF signal S3 naturally appears at the line 108B. The signal level detecting circuit 113 examines the voltage value of the signal so as to detect the signal level of the RF signal S3 which is passed through the signal line 110 and is supplied to the transmission antenna 2.

Incidentally, the voltage value of the signal which appears at the second line 108B is not always equal to the signal level of the RF signal S3 at the transmission antenna end because of the coupling loss of the directional coupler. However, since the coupling loss is constant, if the offset is given to the voltage value, the signal level detecting circuit 113 can detect the signal level of the RF signal S3 easily and correctly.

Also, such signal level detecting circuit 113 is provided to examine the signal level of the RF signal S3, so as to prevent the deviation of the transmission power from a desired value due to the detection of self-oscillation and misoperation of the amplifier 112. Especially, in the cellular telephone system of the code division multiple access (CDMA) method, the transmission power is controlled strictly. Therefore, it is needed to check the transmission power by providing the signal level detecting circuit 113.

With the foregoing configuration, in this embodiment, two signal lines 109, 110 having different gains which are provided at the gain varying circuit 106 are switched to perform the gain adjustment. Specifically, the signal level required at the transmission antenna end is examined to select the signal line 109 having the amplifier 112 if the power amplification is required, and to select the signal line 110 being a merely transmission path without amplifier if the power amplification is not required. At this time, the amplifier 112 is operated only when the signal line 109 is selected. Therefore, it is not needed to constantly operate the amplifier as a conventional one, so as to suppress the unnecessary power consumption. If the transmitter circuit 105 for performing gain adjusting by the gain varying circuit 106 described above is used, a battery life for a mobile terminal can be extended, and hence a communication available time can be made longer.

Also, the directional coupler is used as the signal line change-over switch 108 at the output side of the gain varying circuit 106, so that similar to the third embodiment, the insertion loss which occurs at the signal line change-over switch 108 can be reduced comparing it to the case of using a semiconductor switch.

Further, in the gain varying circuit 106, one end of the line 108B of the directional coupler forming the signal line change-over switch 108 is connected to the signal level detecting circuit 113 via the diode D1. In the gain varying circuit 106, when the signal line change-over switch 107 is switched to supply the RF signal S3 to the transmission antenna 2 via the signal line 109 and the line 108A of the directional coupler, a signal which is depending on the RF signal S3 appears at the line 108B of the directional coupler. When the signal line change-over switch 107 is switched to supply the RF signal S3 to the transmission antenna 2 via the signal line 110, the line 108B of directional coupler, and the line 108A, successively, the RF signal S3 appears at the line 108B naturally. Therefore, one end of the line 108B is connected to the signal level detecting circuit 113 as described above, so that the signal level detecting circuit 113 can take in the voltage value of the signal which appears at the line 108B, and the signal level of the RF signal S3 at the transmission antenna end can be detected based on the voltage value.

In this way, the line 108B of the directional coupler forming the signal line change-over switch 108 is connected to the signal level detecting circuit 113, so that the signal line change-over switch 108 can be also used in common as signal extracting means which is used for detecting the signal level of the RF signal S3. Therefore, it is not necessary to provide extra signal extracting means and the signal level of the RF signal S3 can be detected with simple construction.

With the foregoing configuration, the gain adjustment is performed by switching between the signal line 110 comprising merely transmission path without amplifier and the signal line 109 having the amplifier 112, so that the amplifier 112 is operated only when the signal line 109 is selected. Therefore, the amplifier is not needed to be constantly operated as before, to suppress unnecessary power consumption.

Further, the directional coupler is used as the signal line change-over switch 108 provided at an output side of the gain varying circuit 106, so that the signal lines 109, 110 can be switched with low insertion loss.

Further, the second line 108B of the directional coupler forming the signal line change-over switch 108 is connected to the signal level detecting circuit 113, so that the signal line change-over switch 108 can be also used in common as signal extracting means which is used for detecting the signal level of the RF signal S3. Therefore, the signal level of the RF signal S3 can be detected with simple construction.

(2) Receiver Circuit (2-1) Fifth Embodiment

Figure 17:
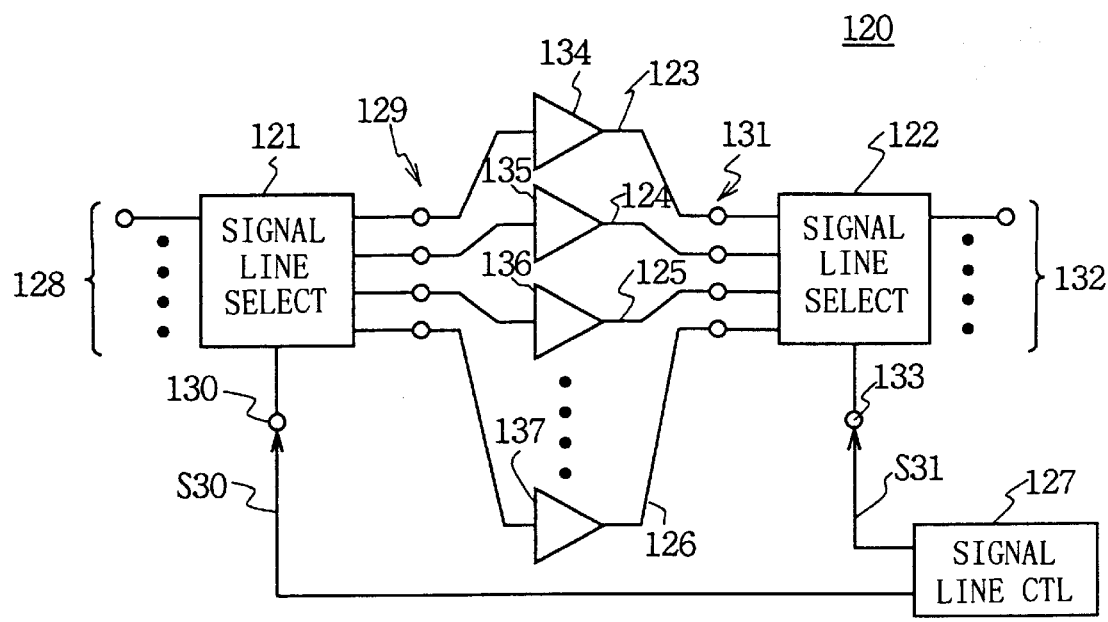
FIG. 17 is a block diagram showing a gain varying means of a receiver circuit used for explaining the principles of the present invention.

First, the principles of a receiver circuit will be described with reference to FIG. 17. A receiver circuit applying the present invention utilizes gain varying means 120 as shown in FIG. 17 to perform gain adjustment while suppressing unnecessary power consumption as well as to avoid a degraded reception sensitivity due to disturbing waves.

Generally, the gain varying means 120 is composed of first and second signal line selecting means 121, 122 each having a plurality of input and output terminals; a plurality of signal lines 123 to 126 having different gains for interconnecting between terminals of the first and second signal line selecting means 121, 122; and a signal line control means 127 for controlling the selecting operations of the first and second signal line selecting means 121, 122.

First, the first signal line selecting means 121 has at least one or more input terminals 128, a plurality of output terminals 129, and a control terminal 130, and is configured such that it can switch a connection relationship between the input terminals 128 and the output terminals 129 in response to a control signal S30 supplied to the control terminal 130.

The second signal line selecting means 122, in turn, has a plurality of input terminals 131, at least one or more output terminals 132, and a control terminal 133, and is configured such that it can switch a connection relationship between the input terminals 131 and the output terminals 132 in response to a control signal S11 supplied to the control terminal 133.

The output terminals 129 of the signal line selecting means 121 are connected to the input terminals 131 of the signal line selecting means 122 by the signal lines 123 to 126 having different gains from each other. In this configuration, signal amplifying means 134 to 137 having different gains from each other are inserted in the signal lines 123 to 126, respectively, so that the respective signal lines are provided with different gains.

The signal line control means 127, which controls selecting operations of the first and second signal line selecting means 121, 122, determines a signal lines (123 to 126) to be selected in accordance with a signal level supplied to the input terminal 128, and outputs the control signals S30, S31 in accordance with the determination result to control the selecting operations of the signal line selecting means 121, 122.

Figure 18:
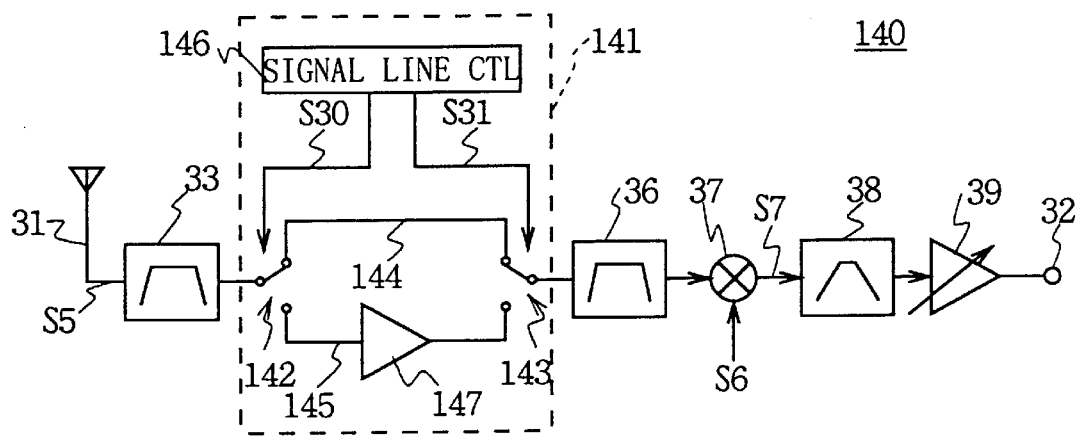
FIG. 18 is a flow chart showing a control procedure of a signal line control means in the gain varying means.

More specifically, in this event, the signal line control means 127 executes a control procedure as shown in FIG. 18. The control procedure first begins at step SP40, and the control means 127 controls the signal line selecting means 121, 122 to set a suitable signal line out of the signal lines 123 to 126 at step SP41. Next, at step SP42, the control means 127 reads a gain value "G" possessed by the set signal line from a predetermined storage means. Next, at step SP43, the control means 127 measures the level "C" of an output signal outputted at an output terminal 132 through the set signal line. Next, at step SP44, the control means 127 calculates the level "D" of an input signal supplied to the input terminal 128 based on the measured signal level "C" and the gain value "G". Next, at step SP45, the control means 127 selects a suitable signal line from the signal lines 123 to 126 based on the signal level "B" of the input signal. In other words, the most suitable signal line is selected in order to adjust the input signal to the level required at the output terminal 132. Next, the control means 127 sets the selected signal line at step SP41, and subsequently repeats the foregoing processing.

In this way, the gain varying means 120 switches the signal lines 123 to 126 in accordance with a signal level supplied at the input terminal 128 to perform the gain adjustment for the whole receiver circuit, thus supplying the output terminal 132 with a constant level signal. In this event, since the signal amplifying means 134 to 137 have fixed gain values, the gain varying means 120 performs discrete gain adjustment. However, the gain varying means 120 can maintain optimized power consumption of the respective signal amplifying means 134 to 137 in accordance with the respective gain values and can also turn off signal amplifying means arranged in signal lines not selected, thus making it possible to suppress unnecessary power consumption.

Also, since the respective signal amplifying means 134 to 137 in the gain varying means 120 can be set to have different saturation levels from each other, a degradation in the reception sensitivity due to saturation can be avoided by appropriately switching signal lines having different saturation levels, even if strong disturbing waves are present within a receiving band, thus making it possible to improve the disturbing wave resistant characteristics.

Incidentally, at least one or more of the plurality of signal lines 123 to 126 may be replaced with a mere transmission path without signal amplifying means, or an attenuator may be inserted instead of a signal amplifying means in at least one or more of the plurality of signal lines 123 to 126. In this way, a much larger gain difference can be produced, whereby a larger margin can be given to the saturation level of each element with respect to a disturbing wave level, and accordingly, the disturbing wave resistant characteristics are further improved. Also, in this case, since attenuators and transmission paths are essentially passive elements and therefore do not consume electric power, unnecessary power consumption can be more suppressed.

Figure 3:
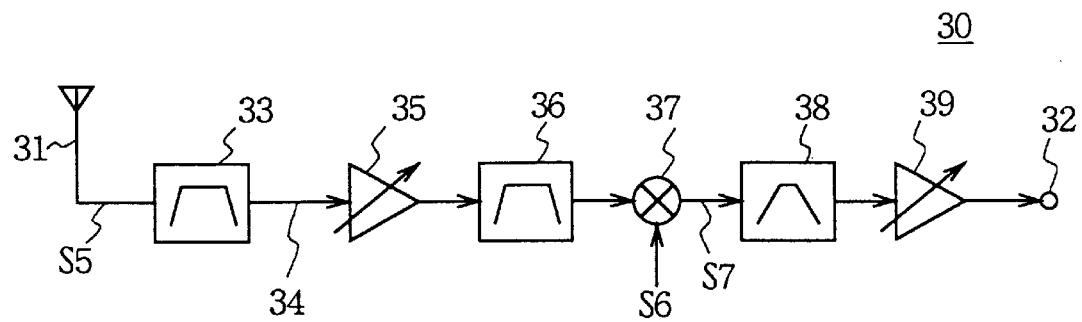
FIG. 3 is a block diagram showing a conventional receiver circuit.
Figure 19:
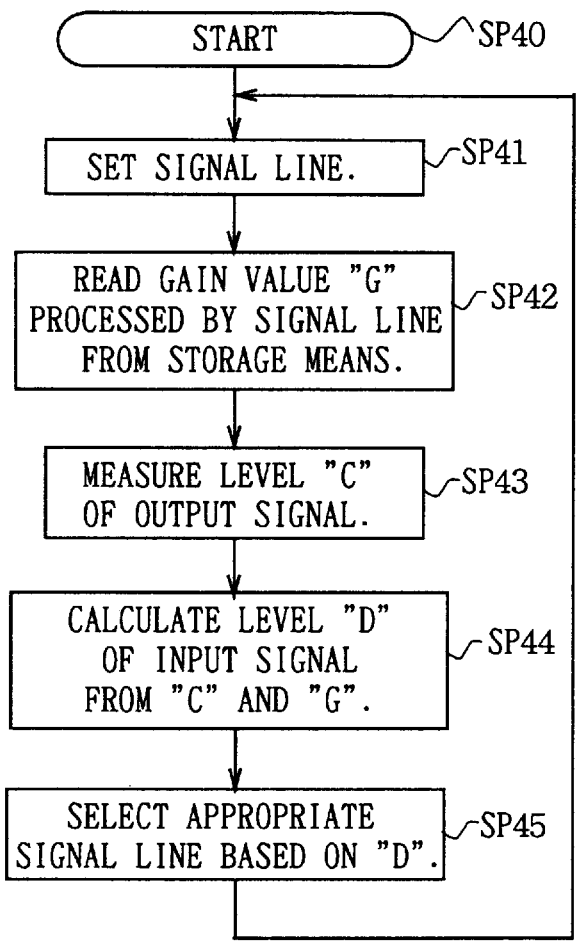
FIG. 19 is a block diagram showing a receiver circuit according to a fifth embodiment.

Here, a receiver circuit actually incorporating the gain varying means 120 as described above is illustrated in FIG. 19 in which parts corresponding to those in FIG. 3 are designated the same reference numerals. In a receiver circuit 140, a gain varying circuit 141 corresponds to the foregoing gain varying means 120. The gain varying circuit 141 performs gain adjustment in an RF frequency band.

Generally, the gain varying circuit 141 is composed of signal line change-over switches 142, 143; signal lines 144, 145 having different gains which are switched by the signal line change-over switches 142, 143; and a signal line control circuit 146 for controlling switching operations of the signal line change-over switches 142, 143. In other words, the signal line change-over switches 142, 143 correspond to the foregoing signal line selecting means 121, 122, the signal lines 144, 145 correspond to the foregoing signal lines 123 to 126, and the signal line control circuit 146 corresponds to the foregoing signal line control means 127.

In this gain varying circuit 141, the signal line 144, one of the two signal lines, is formed of a mere transmission path without amplifier, while the other signal line 145 is provided with an amplifier 147 for amplifying electric power, for example, by 20 [dB]. Incidentally, electric power consumed by the amplifier 147 arranged in the signal line 145 is optimized in accordance with the gain value, and the saturation level thereof is also optimized.

The signal line control circuit 146 outputs control signals S30, S31 to switch the signal line change-over switches 142, 143, thus selecting one of the two signal lines 144, 145. In this event, the signal line control circuit 146 examines a necessary signal level at a reception antenna end to determine whether or not an RF signal S5 requires power amplification. The signal line control circuit 146 selects the signal line 145 when the power amplification is required, and selects the signal line 144 when no power amplification is required. In this way, the power amplification is carried out by the amplifier 147 when the signal level of the RF signal S5 is low, while no power amplification is carried out when the signal level is sufficiently high.

In this way, the gain varying circuit 141 switches the signal lines (144, 145) to perform the gain adjustment. In this event, the gain varying circuit 141 may take two gain conditions: one is a 0 [dB] condition when the signal line 144 is selected, and the other is a 20 [dB] condition when the signal line 145 is selected. As is apparent from this, the gain adjustment at the RF stage is discrete. However, a variable gain amplifier 39 capable of continuous gain adjustment is provided at the IF stage of the receiver circuit 140, such that the continuous gain adjustment is performed by the variable gain amplifier 39 to compensate for the discrete gain adjustment at the RF stage. In other words, the receiver circuit 140 produces a finally desired gain by the two elements: the gain varying circuit 141 performing the discrete gain adjustment and the variable gain amplifier 39 performing the continuous gain adjustment.

Figure 20:
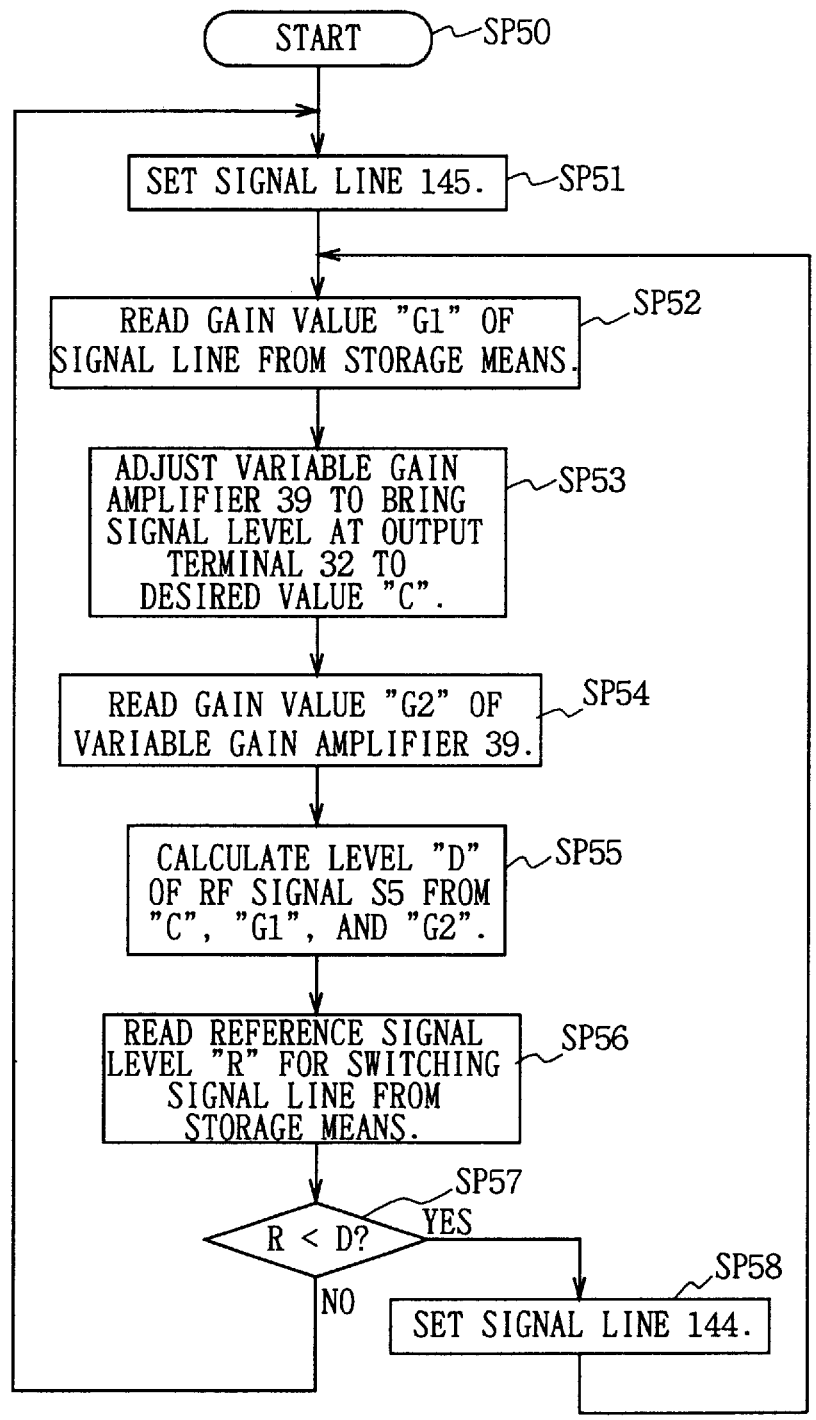
FIG. 20 is a flow chart showing a control procedure of a signal line control circuit according to the fifth embodiment.

Now, a control procedure of the signal line control circuit 146 will be specifically described with reference to a flow chart illustrated in FIG. 20. First, the control procedure begins at step SP50, and at step SP51, the control circuit 146 controls the signal line change-over switches 142, 143 to set the signal line 145 out of the two signal lines, and turns on the amplifier 147 arranged in the signal line 145. Next, at step SP52, the control circuit 146 reads a gain value "G1" possessed by the signal line 145 from a predetermined storage means (specifically, the gain value of the amplifier 147 is read in this case). Next, at step SP53, the control circuit 146 adjusts the variable gain amplifier 39 so as to bring the level of a signal outputted at an output terminal 32 to a predetermined value "C". Next, at step SP54, the control circuit 146 reads a gain value "G2" of the adjusted variable gain amplifier 39. Next, at step SP55, the control circuit 146 calculates the signal level "D" of a received RF signal S5 from the signal level "C", the gain value "G1" of the signal line 145, and the gain value "G2" of the variable gain amplifier 39. Specifically, the signal level "D" is calculated by subtracting the gain value "G1" of the signal line 145 and the gain value "G2" of the variable gain amplifier 39 from the signal level "C".

Next, at step SP56, the control circuit 146 reads a reference signal level "R" for switching a signal line from a predetermined storage means. Then, at next step SP57, the read reference signal level "R" is compared with the previously calculated signal level "D" of the RF signal S5. As a result, if the signal level "D" of the RF signal S5 is higher, the control procedure proceeds to step SP58 for the control circuit 146 to control the signal line change-over switches 142, 143 to set the signal line 144 and to turn the amplifier 147 off, since no power amplification is required. Subsequently, the control procedure returns to step SP52 to repeat the processing. On the other hand, if the signal level "D" of the RF signal S5 is lower, the control procedure immediately returns to step SP51 to repeat the processing, since power amplification is required. Incidentally, when the signal line 144 is set, the variable gain amplifier 39 is again adjusted at step SP53 to provide a desired value of the signal level at the output terminal 32.

In this way, the signal line control circuit 146 calculates the signal level "D" of the RF signal S5, and selects an appropriate signal line based on the calculated signal level "D" to perform the gain adjustment on the RF signal S5 so as to provide a desired signal level at the output terminal 32.

With the foregoing configuration, the gain adjustment is carried out by switching the two signal lines 144, 145 having different gains arranged in the gain varying circuit 141. Specifically, the signal level of a received RF signal S5 is examined, and the signal line 145 having the amplifier 147 is selected if power amplification is required, while the signal line 144 formed of a mere transmission path without amplifier is selected if no power amplification is required. In this event, the amplifier 147 is operated only when the signal line 145 is selected. Thus, the amplifier need not be always operated as before, making it possible to suppress unnecessary power consumption. Therefore, by using the receiver circuit 140 which adjusts the gain by the gain varying circuit 141 as described above, a battery life for a mobile terminal can be extended, and hence a stand-by time and a communication available time can be made longer.

Additionally, in the gain varying circuit 141, if the RF signal S5 has a sufficient signal level, the signal line 144 formed of a mere transmission path is selected so as not to perform power amplification. Thus, even if strong disturbing waves are present in a receiving band, the disturbing waves will not cause the amplifier 147 to saturate, thus preventing a restraint on a received signal due to the saturation. In this way, if the gain varying circuit 141 is used, a degraded reception sensitivity due to disturbing waves can be avoided.

Incidentally, since the gain varying circuit 141 performs the gain adjustment by switching the two signal lines 144, 145 having different gains, the resulting gain adjustment is discrete. For this reason, the receiver circuit 140 utilizes the variable gain amplifier 39 arranged at the IF stage to compensate for a discrete gain change to provide a desired gain change as a whole. By thus performing the whole gain adjustment with both of the gain varying circuit 141 and the variable gain amplifier 39, the dynamic range of each element can be reduced also in the receiver circuit 140.

According to the foregoing configuration, the gain adjustment is carried out by switching the signal line 144 formed of a mere transmission path without amplifier and the signal line 145 having the amplifier 147, and the amplifier 147 is operated only when the signal line 145 is selected, so that the amplifier need not be always operated as before, thus making it possible to suppress unnecessary power consumption.

Also, according to the foregoing configuration, since the signal line 144 formed of a mere transmission path is selected when an RF signal S5 has a sufficient signal level, a restraint on a received signal due to disturbing waves can be prevented, thus making it possible to avoid a degraded reception sensitivity due to the disturbing waves.

(2-2) Sixth Embodiment

Figure 4:
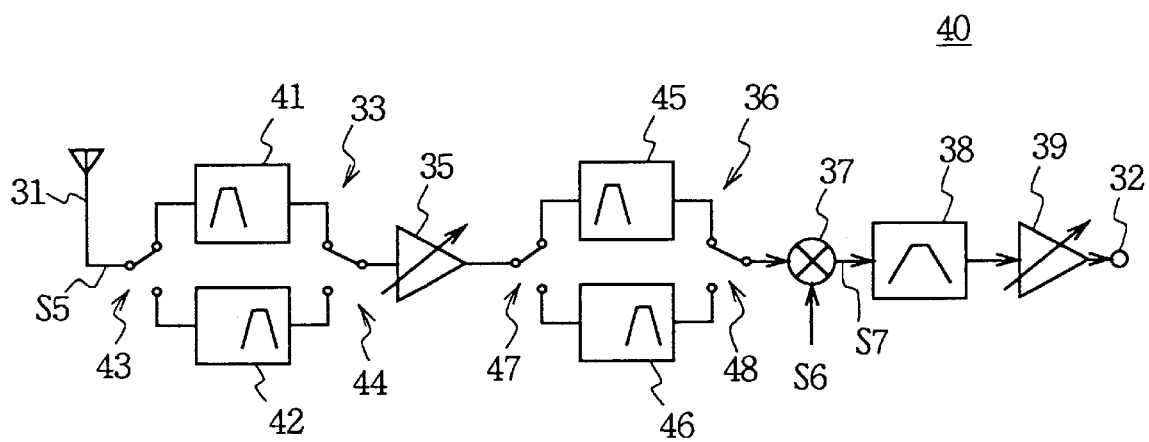
FIG. 4 is a block diagram showing a conventional receiver circuit which has a bandpass filter divided into portions.
Figure 21:
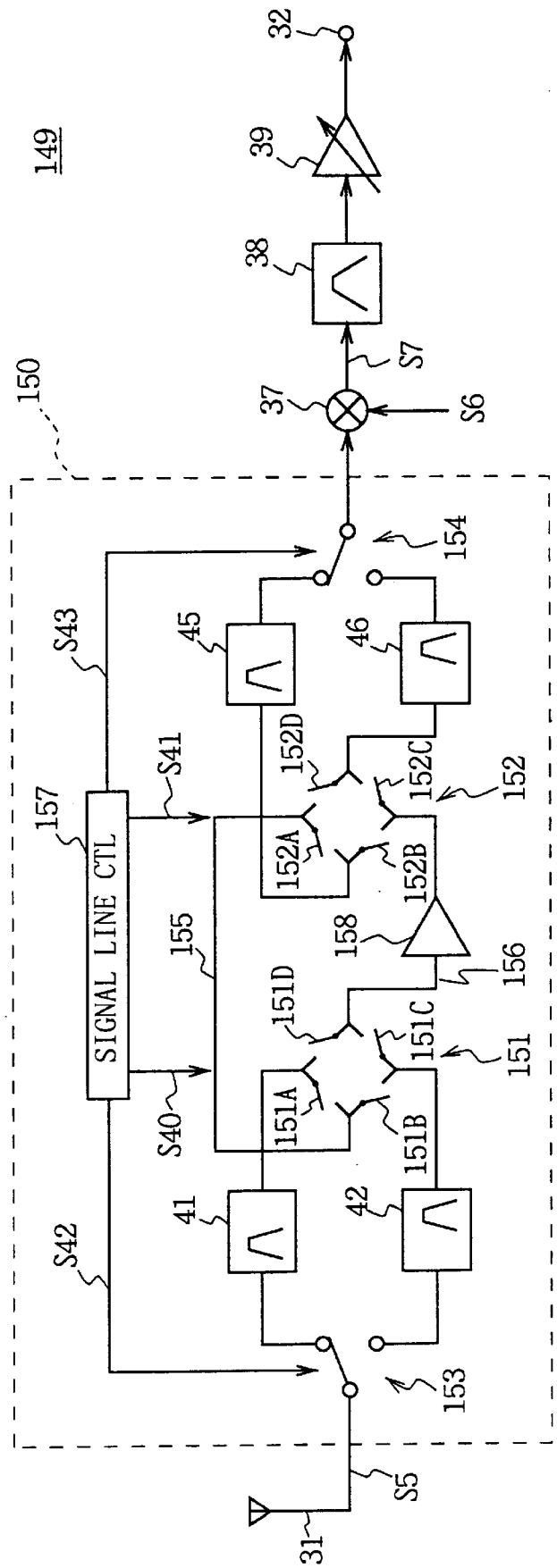
FIG. 21 is a block diagram showing a receiver circuit according to a sixth embodiment.

A receiver circuit 149 according to a sixth embodiment is illustrated in FIG. 21 in which parts corresponding to those in FIG. 4 are designated the same reference numerals. While the foregoing first embodiment has been described for the case where the gain is merely switched by the gain varying circuit 141, this embodiment switches a bandpass filter as well as the gain by a gain varying circuit.

Generally, a gain varying circuit 150 is composed of signal line change-over switches 151, 152 and 153, 154; two signal lines 155, 156 having different gains; bandpass filters 41, 42 and 45, 46 having different pass bands; and a signal line control circuit 157 for controlling switching operations of the signal line change-over switches 151, 152 and 153, 154.

The signal line change-over switch 151 comprises a circular switch composed of four switches 151A to 151D connected in a circular shape, wherein two opposite ones of four connection cross-points are used as input terminals and the remaining two are used as output terminals, so that an input terminal and an output terminal can be connected by a single switch. In this case, the two input terminals are connected to the bandpass filters 41, 42, respectively, while the two output terminals are connected to the signal lines 155, 156, respectively. Thus, the signal line change-over switch 151 switches connection between the bandpass filters 41, 42 and the signal lines 155, 156.

Likewise, the signal line change-over switch 152 also comprises a circular switch composed of four switches 152A to 152D connected in a circular shape, wherein two opposite ones of four connection cross-points are used as input terminals and the remaining two are used as output terminals, so that an input terminal and an output terminal can be connected by a single switch. In this case, the two input terminals are connected to the signal lines 155, 156, respectively, while the two output terminals are connected to the bandpass filters 45, 46, respectively. Thus, the signal line change-over switch 152 switches connection between the signal lines 155, 156 and the bandpass filters 45, 46.

The signal line change-over switch 153 in turn is a switch for switching filters to be applied to an RF signal S5 received by a reception antenna 31, and connects one of the bandpass filters 41, 42 to the reception antenna 31. Also, the signal line change-over switch 154 is a switch for supplying a frequency mixer 37 with the RF signal S5 bandwidth limited by the bandpass filter 45 or the bandpass filter 46, and connects one of the bandpass filters 45, 46 to the frequency mixer 37.

Also in this embodiment, the signal line 155, one of the two signal lines, is formed of a mere transmission path without amplifier, while the other signal line 156 is configured to perform power amplification of, for example, 20 [dB] by an amplifier 158. Incidentally, also in this embodiment, the power consumption of the amplifier 158 arranged in the signal line 156 is optimized in accordance with the gain value, and the saturation level thereof is also optimized.

The bandpass filters 41, 42 are filters having different pass bands from each other so that the two filters cover the whole bandwidth of the RF signal S5. Similarly, the bandpass filters 45, 46 are filters having different pass bands from each other so that the two filters cover the whole bandwidth of the RF signal S5. By thus dividing the pass band, a smaller volume and smaller loss bandpass filter is realized also in the receiver circuit 149.

The signal line control circuit 157 outputs control signals S40, S41 to switch the signal line change-over switches 151, 152, and also outputs control signals S42, S43 to switch the signal line change-over switches 153, 154. In this event, the signal line control circuit 157 examines the signal level of a received RF signal S5 to determine whether or not an RF signal S5 requires power amplification. The signal line control circuit 157 selects the signal line 156 when power amplification is required, and selects the signal line 155 when no power amplification is required. For reference, when the signal line 155 is selected, the amplifier 158 is turned off by the signal line control circuit 157.

Also, the signal line control circuit 157 examines the frequency used by the RF signal S5 to determine which of the bandpass filters should be selected, and switches the signal line change-over switches 151 to 154 based on the determination result.

Incidentally, also in this embodiment, since the gain adjustment is performed by selecting a signal line, the resulting gain adjustment is discrete at the RF stage. For this reason, in the receiver circuit 149, a variable gain amplifier 39 at the IF stage continuously adjusts the gain to compensate for the discrete gain adjustment at the RF stage.

Figure 22:
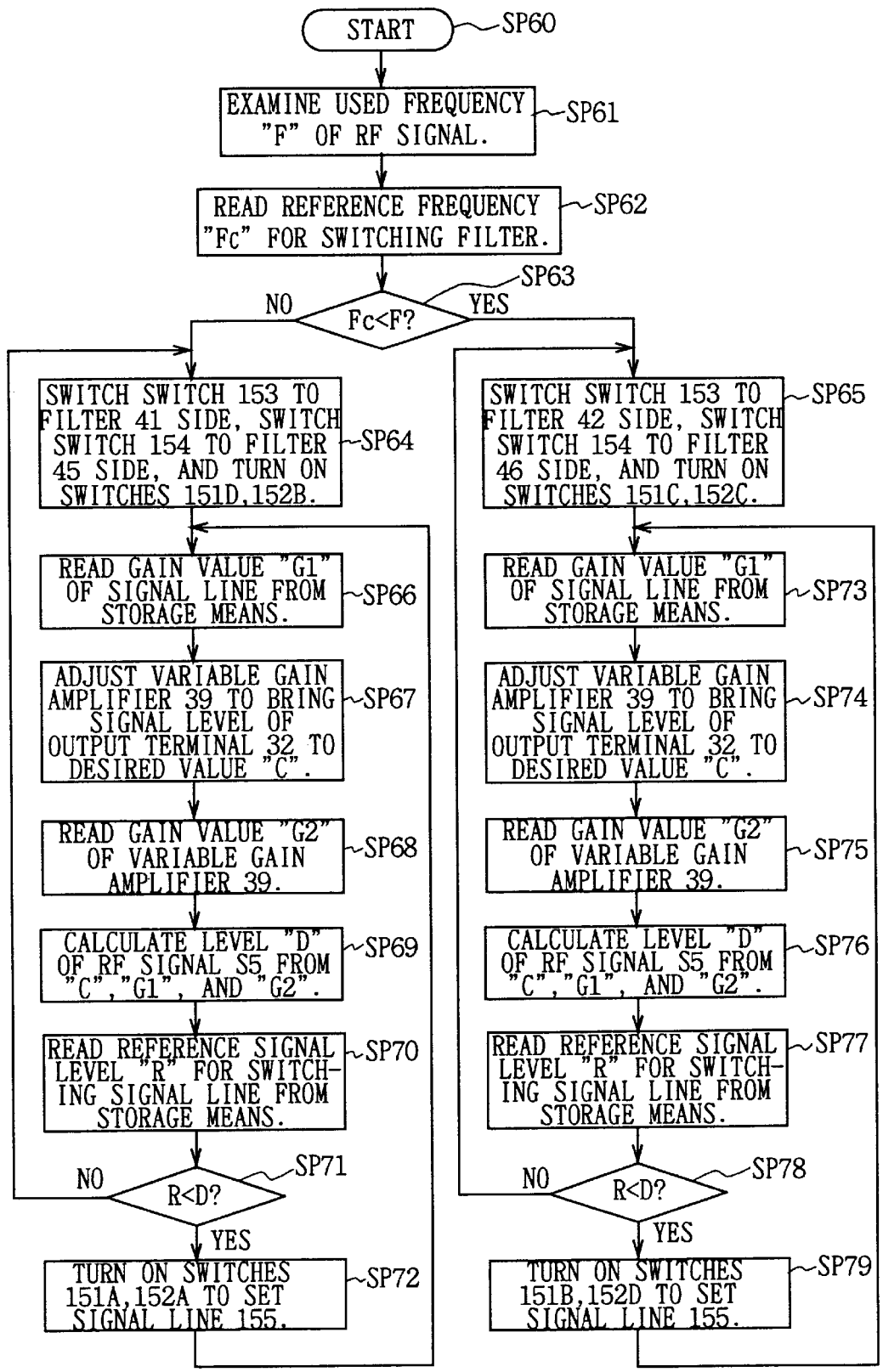
FIG. 22 is a flow chart showing a control procedure of a signal line control circuit according to the sixth embodiment.

Here, a control procedure of the signal line control circuit 157 will be specifically described with reference to a flow chart shown in FIG. 22. First, the control procedure begins at step SP60, and the control circuit 157 examines the used frequency "F" of a received RF signal S5 at step SP61. Next, at step SP62, the control circuit 157 reads a reference frequency "Fc" for switching a bandpass filter from a predetermined storage means. Next, at step SP63, the used frequency "F" of the RF signal S5 is compared with the reference frequency "Fc". As a result, the control procedure proceeds to step SP64 if the used frequency is lower, and to step SP65 if the used frequency "F" is higher.

At step SP64, the control circuit 157 outputs a control signal S42 to switch the signal line change-over switch 153 to the bandpass filter 41 side, and outputs a control signal S43 to switch the signal line change-over switch 154 to the bandpass filter 45 side. Stated another way, the bandpass filters 41, 45 having lower pass bands are selected. Further at step SP64, the control circuit 157 outputs a control signal S40 to turn on the switch 151D of the signal line change-over switch 151, and outputs a control signal S41 to turn on the switch 152B of the signal line change-over switch 152. The control circuit 157 also operates the amplifier 158 to set the signal line 156.

Next, at step SP66, the control circuit 157 reads a gain value "G1" possessed by the signal line 156 from a predetermined storage means. Next, at step SP67, the control circuit 157 adjusts the variable gain amplifier 39 to bring the level of a signal outputted at an output terminal 32 to a desired value "C". Next, at step SP68, the control circuit 157 reads a gain value "G2" of the adjusted variable gain amplifier 39. Next, at step SP69, the control circuit 157 calculates the signal level "D" of the received RF signal S5 from the signal level "C", the gain value "G1" of the signal line 156, and the gain value "G2" of the variable gain amplifier 39. Specifically, the signal level "D" is calculated by subtracting the gain value "G1" of the signal line 156 and the gain value "G2" of the variable gain amplifier 39 from the signal level "C".

Next, at step SP70, the control circuit 157 reads a reference signal level "R" for switching a signal line from a predetermined storage means. Then, at next step SP71, the read reference signal value "R" is compared with the previously calculated signal level "D" of the RF signal S5. As a result, the control procedure proceeds to step SP72 if the signal level "D" of the RF signal S5 is higher, since no power amplification is required, where the control circuit 157 outputs the control signals S40, S41 to turn on the switches 151A, 152A to set the signal line 155 and to turn off the amplifier 158. Subsequently, the control procedure returns to step SP66 to repeat the processing. On the other hand, if the signal level "D" of the RF signal S5 is lower, the control procedure returns immediately to step SP64 to repeat the processing since power amplification is required. Incidentally, when the signal line 155 is set, the variable gain amplifier 39 is again adjusted at step SP67 to provide a desired value of the signal level at the output terminal 32.

On the other, at step SP65, the control circuit 157 outputs the control signal S42 to switch the signal line change-over switch 153 to the bandpass filter 42 side, and outputs the control signal S43 to switch the signal line change-over switch 154 to the bandpass filter 46 side. Stated another way, the bandpass filters 42, 46 having higher pass bands are selected. Further at step SP65, the control circuit 157 outputs the control signal S40 to turn on the switch 151C of the signal line change-over switch 151, outputs the control signal S41 to turn on the switch 152C of the signal line change-over switch 152, and operates the amplifier 158 to set the signal line 156.

Next, at step SP73, the control circuit 157 reads the gain value "G1" possessed by the signal line 156 from the predetermined storage means. Next, at step SP74, the control circuit 157 adjusts the variable gain amplifier 39 to bring the level of a signal outputted at the output terminal 32 to a desired value "C". Next, at step SP75, the control circuit 157 reads the gain value "G2" of the adjusted variable gain amplifier 39. Next, at step SP76, the control circuit 157 calculates the signal level "D" of the received RF signal S5 from the signal level "C", the gain value "G1" of the signal line 156, and the gain value "G2" of the variable gain amplifier 39. Specifically, the signal level "D" is calculated by subtracting the gain value "G1" of the signal line 156 and the gain value "G2" of the variable gain amplifier 39 from the signal level "C".

Next, at step SP77, the control circuit 157 reads the reference signal level "R" for switching a signal line from the predetermined storage means. Then, at next step SP78, the read reference signal level "R" is compared with the previously calculated signal level "D" of the RF signal S5. As a result, if the signal level "D" of the RF signal S5 is higher, the control procedure proceeds to step SP79, since no power amplification is required, where the control circuit 157 outputs the control signals S40, S41 to turn on the switches 151B, 151D to set the signal line 155 and to turn off the amplifier 158. Subsequently, the control procedure returns to step SP73 to repeat the processing. On the other hand, if the signal level "D" of the RF signal S5 is lower, the control procedure returns immediately to step SP65 to repeat the processing since power amplification is required. Incidentally, when the signal line 155 is set, the variable gain amplifier 39 is again adjusted at step SP74 to provide a desired value of the signal level at the output terminal 32.

As described above, the signal line control circuit 157 switches bandpass filters (41, 42, 45, 46) in accordance with the used frequency of the RF signal S5, and selects an appropriate signal line in accordance with the signal level "D" of the RF signal S5 to perform the gain adjustment on the RF signal S5, such that a desired signal level is provided at the output terminal 32.

With the foregoing configuration, in this embodiment, the bandpass filter is switched together with the gain adjustment by the gain varying circuit 150. In this event, the signal line control circuit 157 controls switching states of the signal line change-over switches 151 to 154 in the gain varying circuit 150 to simultaneously perform the gain adjustment and the switching of the bandpass filter.

Incidentally, in this embodiment, the connection between one of the two signal lines having different pass band characteristics (i.e., the signal line having the bandpass filter 41 and the signal line having the bandpass filter 42) and one of the two signal lines 155, 156 having different gains is switched by the signal line change-over switch 151 comprising a circular switch.

When the connection is switched by the signal line change-over switch 151 comprising a circular switch as mentioned above, insertion loss occurring in the signal line change-over switch 151 can be reduced. This is because, in the circular switch, the signal line is switched by turning on one of the four switches 151A to 151D, so that only one switch is inserted in the signal line. Generally, for switching the connection between one of two lines on the input side and one of two lines on the output side, it is often the case that the switching is carried out by a combination of two switches. In this case, however, two switches are inserted in a signal line, resulting in larger insertion loss. On the other hand, when a circular switch is used as is the case of this embodiment, only one switch is inserted in a signal line, so that the insertion loss can be reduced.

Also in this embodiment, the connection between one of the two signal lines 155, 156 having different gains and one of the two signal lines having different pass band characteristics (i.e., the signal line having the bandpass filter 45 and the signal line having the bandpass filter 46) is switched by the signal line change-over switch 152 comprising a circular switch. By a similar reason, insertion loss can be reduced also in this portion.

Incidentally, also in this embodiment, since the amplifier 158 is operated only when the signal line 156 is selected, useless power consumption can be suppressed. Further, the signal line formed of a mere transmission path is selected when the RF signal S5 has a sufficient signal level, so that even if disturbing waves are present in a receiving band, the amplifier 158 is prevented from saturating, thus making it possible to avoid a degraded reception sensitivity due to the disturbing waves. Additionally, in this embodiment, since the whole gain adjustment is performed by both of the gain varying circuit 150 and the variable gain amplifier 39, the dynamic range of each element can be reduced.

According to the foregoing configuration, since the signal line change-over switches 151, 152 each comprising a circular switch are used for switching the signal lines, the connection between one of the signal lines having different pass band characteristics and one of the signal lines 155, 156 having different gains can be simultaneously switched with lower insertion loss.

(2-3) Seventh Embodiment

Figure 23:
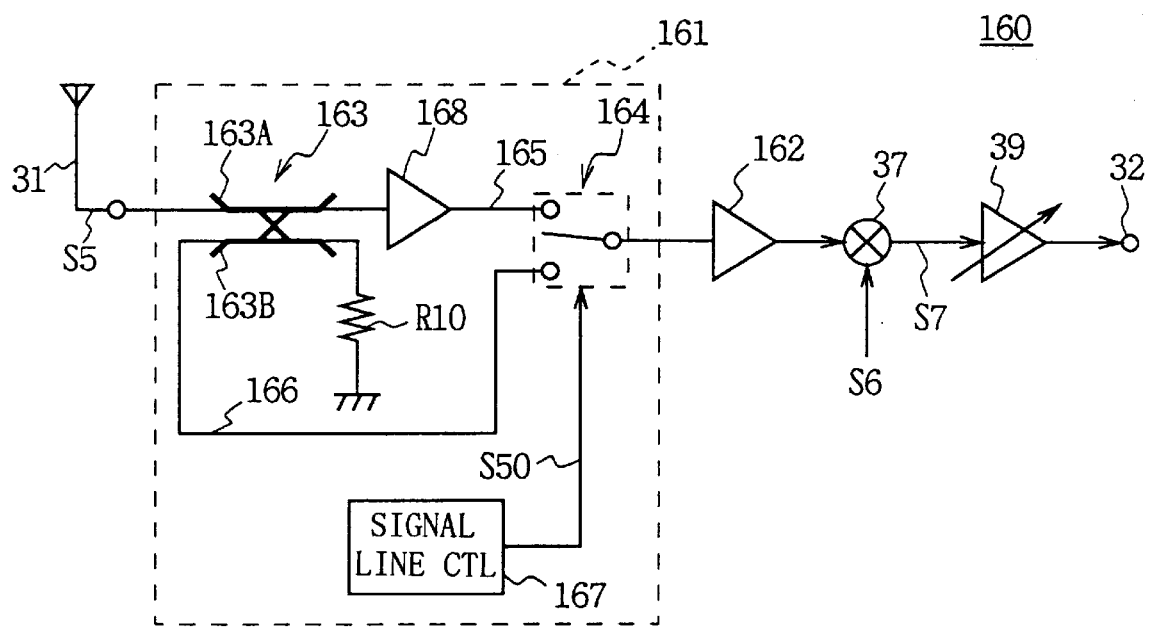
FIG. 23 is a block diagram showing a receiver circuit according to a seventh embodiment.

In FIG. 23, the numeral 160 shows a receiver circuit according to a seventh embodiment as a whole. In the case of the receiver circuit 160, a gain varying circuit 161 is used for suppressing the unnecessary power consumption and performing gain adjustment.

First, an IF signal S5 having a level fluctuation, received by a reception antenna 31, is inputted to a gain varying circuit 161. The gain varying circuit 161 allows the RF signal S5 to pass through a signal line having a specific gain value if the RF signal S5 is needed to be amplified, and to pass through a mere transmission path if the RF signal S5 is not needed to be amplified. Thereby, the RF signal S5 is adjusted for the gain to a desired signal level.

The RF signal S5 which is gain-adjusted by the gain varying circuit 161 is next inputted to a RF driver circuit 162 where the RF signal S5 is subjected to a predetermined signal processing and is inputted to a frequency mixer 37. The RF driver circuit 162 is composed of a bandpass filter, buffer amplifier, and so on, and removes unnecessary frequency components from the RF signal S5 and performs the impedance adjustment, etc. when the RF signal S5 is supplied to the frequency mixer 37.

The frequency mixer 37 frequency-converts the RF signal into an IF signal S7 having a low frequency by using a local signal S6. The IF signal S7 is input to the variable gain amplifier 39 where it is finally adjusted for gain to a desired value, and is output to the output terminal 32.

Generally, the gain varying circuit 161 is composed of signal line change-over switches 163, 164; signal lines 165, 166 having different gains which are switched by the signal line change-over switches 163, 164; and a signal line control circuit 167 for controlling switching operations of the signal line change-over switch 163, 164.

In the case of the gain varying circuit 161, one signal line 166 of two signal lines is formed by a mere transmission path without amplifier, while the other signal line 165 is so configured as to perform power amplification by an amplifier 168.

The signal line change-over switch 163 is a switch formed by a directional coupler composed of two parallel lines (163A, 163B), and outputs the RF signal S5 received by the reception antenna 31 to the signal lines 165, 166. More specifically, in the signal line change-over switch 163, the reception antenna 31 is connected to one end of a first line 163A, while the amplifier 168 of the signal line 165 is connected to the other end, so that the RF signal S5 received at the reception antenna 31 is passed through the first line 163A to be supplied to the signal line 165. Also, the signal line 166 is connected to one end of a second line 163B, while a resistance R10 having the same value as the characteristic impedance of the second line 163B is connected to the other end, so that the RF signal S5 is picked up by the second line 163B by the inter-lines coupling of the two parallel lines to be supplied to the signal line 166.

On the other hand, the signal line change-over switch 164 is a switch formed by a semiconductor switch, which supplies the RF signal S5 passed through the signal line 165 or 166 to the RF driver circuit 162.

The signal line control circuit 167 outputs a control signal S50 to the signal line change-over switch 164 to switch the connection relationship of the signal line change-over switch 164, thereby one of two signal lines 165, 166 is selected. More specifically, the signal line control circuit 167 examines a signal level at the transmission antenna end to determine whether or not the RF signal S5 requires power amplification. The signal line control circuit 167 selects the signal line 165 when the power amplification is required, and selects the signal line 166 when no power amplification is required. Therefore, the power amplification is performed by the amplification 168 of the signal line 165 when the signal level of the RF signal S5 is low, and the power amplification is not performed when the signal level is sufficiently high. When the signal line 166 is selected, the amplifier 168 of the signal line 165 is turned off by the signal line control circuit 167.

Incidentally, also in this embodiment, since the gain adjustment performed by selecting the two signal lines (165, 166), the resulting gain adjustment is discrete at the RF stage. For this reason, the receiver circuit 160 successively adjusts for gain at the variable gain amplifier 39 at the IF stage to compensate for a discrete gain adjustment at the RF stage.

With the foregoing configuration, in the case of the gain varying circuit 161, the gain adjustment is carried out by examining the signal level of the received RF signal S5 and selecting the signal lines 165 having the amplifier 168 when power amplification is required, while selecting the signal line 166 formed of a mere transmission path without an amplifier when no power amplification is required. At this time, the amplifier 168 is operated only when the signal line 165 is selected. Thus, the amplifier need not be always operated as before, making it possible to suppress unnecessary power consumption. Therefore, by using the receiver circuit 160 which adjusts the gain by the gain varying circuit 161 as described above, a battery life for a mobile terminal can be extended, and hence a communication available time can be made longer.

Also, in the gain varying circuit 161, since the signal line 166 being a mere transmission path is not selected to perform the gain amplification when the RF signal S5 has sufficient signal level, even if strong disturbing waves are present within a receiving band, the amplifier 168 is not saturated by disturbing waves and suppression of the received signal due to the saturation can be avoided. Therefore, the gain varying circuit 161 is used to avoid a degradation in the reception sensitivity due to the disturbing wave.

Further, in the gain varying circuit 161, a semiconductor switch is not used as the signal line change-over switch 163, but a directional coupler is used, so as to decrease the insertion loss generated at the signal line change-over switch 163. More specifically, the insertion loss in the case of semiconductor switch is about 0.6 [dB], and the insertion loss in the case of directional coupler is about 0.1 [dB]. The insertion loss can be reduced for the difference between the values (0.5 [dB]=10% approx.).

With the above configuration, the gain adjustment is carried out by switching the signal line 166 which is a merely transmission path without an amplifier and the signal line 165 having the amplifier 168, so that the amplifier 168 can be operated only when the signal line 165 is selected. Therefore, it is unnecessary to constantly operate the amplifier as before, so that the unnecessary power consumption can be suppressed.

Further, the directional coupler is used as the signal line change-over switch 163, so as to reduce the insertion loss in the gain varying circuit 161.

(2-4) Eighth Embodiment

Figure 24:
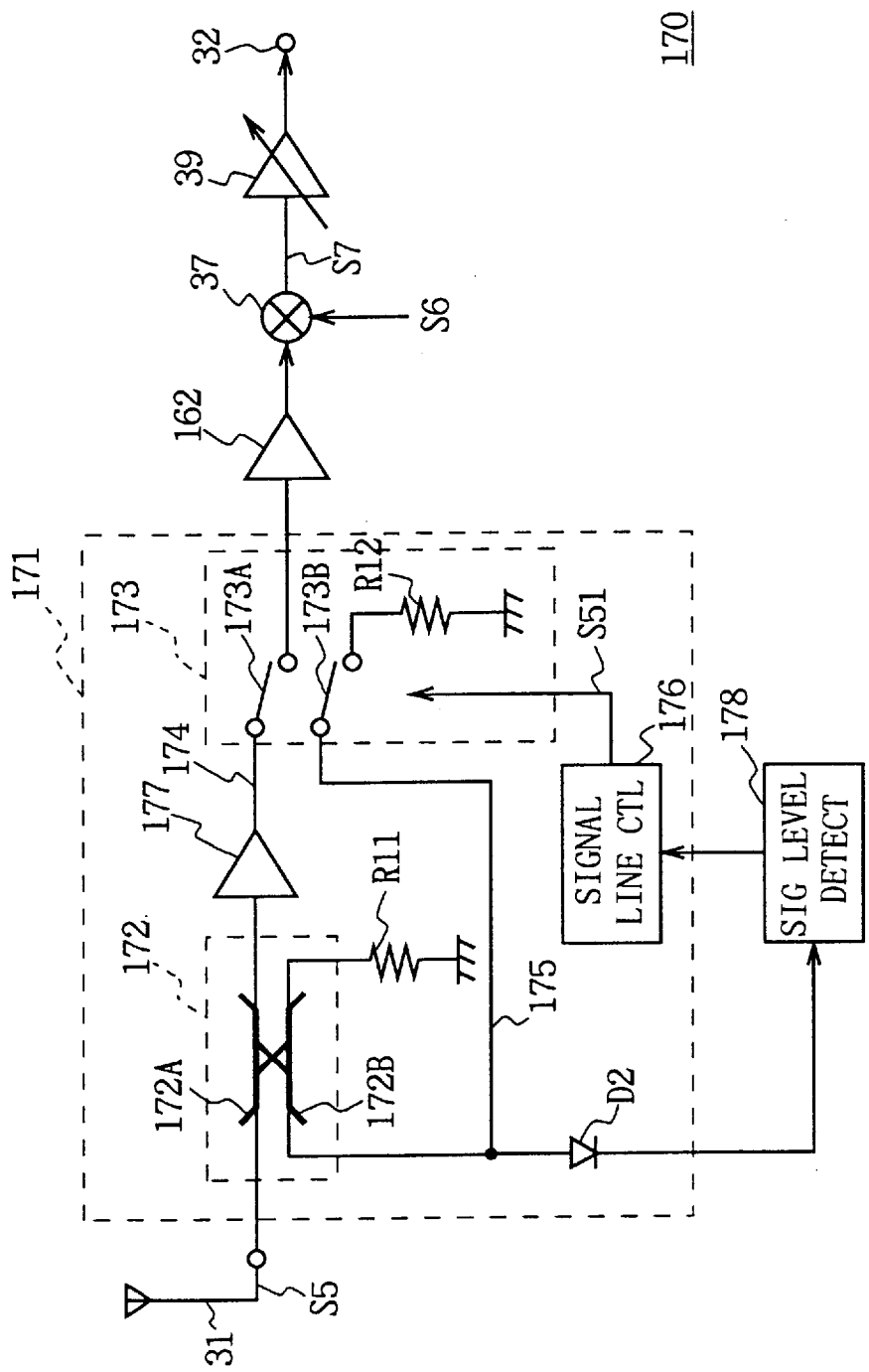
FIG. 24 is a block diagram showing a receiver circuit according to an eighth embodiment.

In FIG. 24, in which the portions corresponding to those of FIG. 23 are designated with the same symbols, the numeral 170 shows a receiver circuit as a whole according to the eighth embodiment. Also in this embodiment, a gain varying circuit 171 is used for switching signal lines each having a different gain and performing gain adjustment of the RF signal S5.

Generally, the gain varying circuit 171 is composed of signal line change-over switches 172, 173; two signal lines 174, 175 having different gains; and a signal line control circuit 176 for controlling switching operations of the signal line change-over switch 173.

In the gain varying circuit 171, one signal line 175 of two signal lines is formed by a mere transmission path without an amplifier, while the other signal line 174 is so configured as to perform power amplification by an amplifier (PA) 177. In addition, the power consumption of the amplifier 177 provided at the signal line 174 is optimized in accordance with the gain value.

The signal line change-over switch 172 is formed by a directional coupler composed of two parallel lines (172A, 172B) similar to the seventh embodiment, and outputs the RF signal S5 received by the reception antenna 31 to the signal lines 174, 175. More specifically, in the signal line change-over switch 172, the reception antenna 31 is connected to one end of a first line 172A, while the amplifier 177 of the signal line 174 is connected to the other end, so that the RF signal S5 received by the reception antenna 31 is supplied to the signal line 174 through the first line 172A. Also, the signal line 175 is connected to one end of a second line 172B, while a resistance R11 having the same value as the characteristic impedance of the second line 172B is connected to the other end, so that the RF signal S5 is picked up at the second line 172B by the inter-lines coupling of the two parallel lines to be supplied to the signal line 175.

On the other hand, the signal line change-over switch 173 is formed by a four-terminals switch in which two semiconductor switches 173A, 173B are combined. One semiconductor switch 173A switches a connection between the signal line 174 and the RF driver circuit 162, and the other semiconductor switch 173B switches a connection between the signal line 175 and the RF driver circuit 162. In addition, the semiconductor switch 173B connects the signal line 175 to a resistance R12 when the signal line 175 is not connected to the RF driver circuit 162.

The signal line control circuit 176 outputs a control signal S51 to the signal line change-over switch 173 to control the connection relationship of the signal line change-over switch 173. More specifically, the signal line control circuit 176 examines a signal level at the reception antenna end to determine whether or not the RF signal S5 requires power amplification. The signal line control circuit 176 selects the signal line 174 when the power amplification is required, and selects the signal line 175 when no power amplification is required. Therefore, the power amplification is performed by the amplifier 177 of the signal line 174 when the signal level of the RF signal S5 is low, and power amplification is not performed when the signal level is sufficiently high. For reference, when the signal line 175 is selected, the amplifier 177 of the signal line 174 is turned off by the signal line control circuit 176.

One end of the second line 172B of the signal line change-over switch 172 is connected to a signal level detecting circuit 178 via a diode D2, so that the voltage value of the signal which appears on the second line 172B can be taken in at the signal level detecting circuit 178. The signal level detecting circuit 178 is a circuit for detecting the signal level of the RF signal S5 received at the reception antenna 31, and detects the signal level of the RF signal S5 based on the voltage value of a signal which appears at the second line 172B.

For instance, when the RF signal S5 is supplied to the RF driver circuit 162 via the signal line 174 and the semiconductor switch 173A, a signal which is depending on the RF signal S5 appears at the line 172B by the inter-lines coupling of the directional coupler. The signal level detecting circuit 178 examines the voltage value of the signal so as to detect the signal level of the received RF signal S5. In addition, at this time, one end of the line 172B is connected to the resistance R12 having the same value as the characteristic impedance of the line 172B via the semiconductor switch 173B, so that the line 172B is subjected to the impedance matching. Therefore, the line 172B can pick up a signal with a stable condition.

Further, when the RF signal S5 is supplied to the RF driver circuit 162 via the line 175 and the semiconductor switch 173B, the RF signal S5 is picked up by the inter-lines coupling on the line 172B, thereby supplied to the RF driver circuit 162. Therefore, the RF signal S5 naturally appears at the line 172B. The signal level detecting circuit 178 examines the voltage value of the signal so as to detect the signal level of the received RF signal S5.

Incidentally, the voltage value of the signal which appears at the second line 172B is not always equal to the signal level of the RF signal S5 at the reception antenna end because of the coupling loss of the directional coupler. However, since the coupling loss is constant, if the offset is given to the voltage value, the signal level detecting circuit 178 can detect the signal level of the RF signal S5 easily and correctly.

In this way, information of the signal level of the RF signal S5 detected by the signal level detecting circuit 178 is supplied to the signal line control circuit 176. Thus, the signal line control circuit 176 can control the switching operation of the signal line change-over switch 173 in accordance with the signal level of the RF signal S5 as described above.

With the foregoing configuration, in the gain varying circuit 171, the signal level of the received RF signal S5 is examined and the signal line 174 having the amplifier 177 is selected if the power amplification is required, while the signal line 175 being a mere transmission path without amplification is selected if the power amplification is not required, so as to perform gain adjustment. At this time, the amplifier is operated only when the signal line 174 is selected. Therefore, it is not needed to constantly operate the amplifier as a conventional one, so as to suppress the unnecessary power consumption. If the receiver circuit 170 for performing gain adjusting by the gain varying circuit 171 described above is used, a battery life for a mobile terminal can be extended, and hence the communication time available time can be made longer.

Also, in the gain varying circuit 171, similar to the seventh embodiment, since the signal line 175 is selected not to perform the power amplification when the signal level of the RF signal S5 is sufficient, even if strong disturbing waves exist within a reception band, the amplifier 177 is not saturated with the disturbing waves so as to prevent the suppress of the received signal due to the saturation. Therefore, using the gain varying circuit 171 can avoid a degraded reception sensitivity due to the disturbing waves.

Further, in the gain varying circuit 171, similar to the seventh embodiment, the semiconductor switch is not used as the signal line change-over switch 172, but the directional coupler is used, so as to reduce the insertion loss generated at the signal line change-over switch 172.

Also, the second line 172B of the directional coupler forming the signal line change-over switch 172 is connected to the signal level detecting circuit 178 via the diode D2, so that the signal level detecting circuit 178 can take in the signal which appears at the second line 172B to examine the voltage value, and the signal level of the RF signal S5 can be detected easily. Thus, in the gain varying circuit 171, the signal line change-over switch 172 can be also used in common as signal extracting means which is used for detecting the signal level of the RF signal S5. Therefore, it is not necessary to provide extra signal extracting means and the signal level of the RF signal S5 can be detected with simple construction.

With the foregoing configuration, the gain adjustment is performed by switching between the signal line 175 comprising merely transmission path without an amplifier and the signal line 174 having the amplifier 177, so that the amplifier 177 is operated only when the signal line 174 is selected. Therefore, the amplifier is not needed to be constantly operated as before, to suppress unnecessary power consumption.

Further, the directional coupler is used as the signal line change-over switch 172 provided at an output side of the gain varying circuit 171, so that the signal lines 174, 175 can be switched with low insertion loss.

Further, the second line 172B of the directional coupler forming the signal line change-over switch 172 is connected to the signal level detecting circuit 178, so that the signal line change-over switch 172 can be also used in common as signal extracting means which is used for detecting the signal level of the RF signal S5. Therefore, the signal level of the RF signal S5 can be detected with simple construction.

(3) Other Embodiments

The foregoing first, second, third, and fourth embodiments have been described for the case where the amplifier 77, 88, 98, or 112 is used to change the gain of the signal line and simple transmission paths are combined to change the gain of the signal line. However, the present invention is not limited to this, but attenuators can be used to change the gain of a signal line. In this case, since the attenuator itself does not consume electric power, a much larger effect can be produced in view of the suppression of unnecessary power consumption.

Also, the foregoing first, second, third, and fourth embodiments have been described for the case where the gain varying circuit 71, 80, 91, or 106 is used to perform the gain adjustment on a signal in an RF frequency band (i.e., RF signal S3). However, the present invention is not limited to this but, the gain varying circuits 71, 80, 91, or 106 can be used to perform the gain adjustment on a signal in an IF frequency band (i.e., IF signal S1). For reference, considering the combination, there are two cases: a case where the gain varying circuit 71, 80, 91, or 106 is provided at a previous stage and at a rear stage of a frequency mixer to perform gain adjustment for a signal of first and second frequency; and a case where the gain varying circuit 71, 80, 91, or 106 is provided at either of the previous stage or the rear stage of the frequency mixer to perform gain adjustment by using the gain varying circuit 71, 80, 91, or 106 for a signal of first frequency and to perform gain adjustment by using a variable gain amplifier for a signal of second frequency.

Further, the foregoing first, second, third, and fourth embodiments have been described for the case of simply providing a plurality of signal lines having different gains. However, the present invention is not limited to this but, delay elements can be arranged in signal lines so as to equalize signal delay differences between the signal lines. In this way, the signal delay difference can also be simultaneously equalized in the gain varying circuit.

Further, the foregoing second embodiment has been described for the case where a signal line having a bandpass filter and a signal line change-over switch are provided both at the input side and output side of the gain varying circuit 80. However, the present invention is not only limited to this but, a signal line having a bandpass filter and a signal line change-over switch can be provided at either of the input side or output side of the gain varying circuit. In addition, in this configuration, the signal line change-over switch at the nearest place to the output side of the gain varying circuit can be formed with the directional coupler, adopting the third and fourth embodiments.

Further, the foregoing third and fourth embodiments have been described for the case where a directional coupler is used as the signal line change-over switches 94, 108 at the nearest place to the output side of the gain varying circuits 91, 106. However, the present invention is not only limited to this but, a directional coupler can be used as the signal line change-over switches 73, 84 at the nearest place of the output side of the gain varying circuits 71, 80 in the first and second embodiments. Thus, the insertion loss generated at the signal line change-over switches 73, 84 can be reduced and the signal line change-over switches 73, 84 can be used in common with signal extracting means in the signal level detection.

Further, the foregoing fifth, sixth, seventh, and eighth embodiments have been described for the case where the amplifier 147, 158, 168, or 177 is used to change the gain of the signal line and simple transmission paths are combined to change the gain of the signal line. However, the present invention is not only limited to this but, an attenuator can be used to change the gain of the signal line. In this case, since the attenuator itself which is a receiving element does not consume electric power, a much larger effect can be produced in view of the suppression of unnecessary power consumption.

Also, the foregoing fifth, sixth, seventh, and eighth embodiments have been described for the case where the gain varying circuit 141, 150, 161, or 171 is used to perform the gain adjustment on a signal in an RF frequency band (i.e., RF signal S5). However, the present invention is not limited to this but, the gain varying circuit 141, 150, 161, or 171 can be used to perform the gain adjustment on a signal in an IF frequency band (i.e., IF signal S7). For reference, considering the combination, there are two cases: a case where the gain varying circuit 141, 150, 161, or 171 is provided at a previous stage and at a rear stage of a frequency mixer to perform gain adjustment for a signal of first and second frequency; and a case where the gain varying circuit 141, 150, 161, or 171 is provided at either of the previous stage or the rear stage of the frequency mixer to perform gain adjustment by using the gain varying circuit 141, 150, 161, or 171 for a signal of first frequency and to perform gain adjustment by using a variable gain amplifier for a signal of second frequency.

Further, the foregoing fifth, sixth, seventh, and eighth embodiments have been described for the case of simply providing a plurality of signal lines having different gains. However, the present invention is not limited to this but, delay elements can be arranged in signal lines so as to equalize signal delay differences between the signal lines. In this way, the signal delay differences can also be equalized simultaneously in the gain varying circuit.

Further, the foregoing sixth embodiment has been described for the case where a signal line having a bandpass filter and a signal line change-over switch are provided both at the input side and output side of the gain varying circuit 150. However, the present invention is not only limited to this but, a signal line having a bandpass filter and a signal line change-over switch can be provided at either of the input side or output side of the gain varying circuit. In addition, in this configuration, the signal line change-over switch at the nearest place to the output side of the gain varying circuit can be formed with the directional coupler, adopting the seventh and eighth embodiments.

Further, the foregoing seventh and eighth embodiments have been described for the case where a directional coupler is used as the signal line change-over switches 163, 172 at the nearest place to the output side of the gain varying circuits 161, 171. However, the present invention is not only limited to this but, a directional coupler can be used as the signal line change-over switches 142, 153 at the nearest place of the output side of the gain varying circuits 141, 150 in the fifth and sixth embodiments. Thus, the insertion loss generated at the signal line change-over switches 142, 153 can be reduced and the signal line change-over switches 142, 153 can be used in common with signal extracting means in the signal level detection.

According to the present invention as described above, an appropriate signal line is selected by signal amplifying means from a plurality of signal lines having different gains, to perform gain adjustment on a transmission signal supplied to an input terminal. Therefore, the power consumption of each signal amplifying means is optimized in accordance with the gain value, and the operation of the signal amplifying means on the signal line which is not selected can be halted, so as to suppress an unnecessary power consumption.

Further, according to the present invention, an appropriate signal line is selected by signal amplifying means from a plurality of signal lines having different gains to perform gain adjustment on a received signal supplied to an input terminal. Therefore, the power consumption of each signal amplifying means can be optimized in accordance with the gain value, and the operation of the signal amplifying means on the signal line which is not selected can be halted, so as to suppress an unnecessary power consumption. Also, since the signal path having low gain is selected when the received signal has sufficient signal level, even if strong disturbing waves exists within the reception band, the saturation of the signal amplifying means due to the disturbing waves can be previously avoided to prevent the suppression of the received signal, thereby making it possible to avoid a degraded reception sensitivity due to the disturbing waves.

While there has been described in connection with the preferred embodiments of the invention, it will be obvious to those skilled in the art that various changes and modifications may be aimed, therefore, to cover in the appended claims all such changes and modifications which fall within the true spirit and scope of the invention.

What is claimed is:

1. A transmitting apparatus having gain varying means and adjusting a gain of a signal to be transmitted using said gain varying means, wherein said gain varying means comprises:

first signal line selecting means having at least one input terminal, a plurality of output terminals, and a control terminal for switching a connection relationship between said at least one input terminal and said plurality of output terminals;

second signal line selecting means having a plurality of input terminals, at least one output terminal, and a control terminal for switching a connection relationship between said plurality of input terminals and said at least one output terminal;

a plurality of signal lines for connecting, on a one-by-one basis, said plurality of output terminals of said first signal line selecting means to said plurality of input terminals of said second signal line selecting means, said plurality of signal lines having different gains provided by signal amplifying means; and signal line control means for comparing a signal level of the signal to be transmitted with a signal level corresponding to a desired transmission power and for controlling in response to the comparing the switching of the connection relationship in said first signal line selection means and the connection relationship in said second signal line selecting means by applying control signals to said control terminal of said first signal line selecting means and said control terminal of said second signal line selecting means, wherein said signal line control means selects an optimal signal line from said plurality of signal lines based on a result of the comparing to adjust the gain on the signal to be transmitted, which is supplied to said at least one input terminal of said first signal line selecting means.

2. The transmitting apparatus according to claim 1, wherein a transmission path having no signal amplifying means is used for at least one of said plurality of signal lines.

3. The transmitting apparatus according to claim 2, wherein said signal amplifying means includes a plurality of amplifiers attached to said plurality of signal lines for inserting said different gains in said plurality of signal lines.

4. The transmitting apparatus according to claim 2, wherein when said signal to be transmitted is frequency converted by a frequency mixer, a signal to be transmitted at a first frequency is adjusted for the gain by said gain varying means, and a signal to be transmitted at a second frequency through said frequency mixer is adjusted for the gain by a predetermined variable gain amplifier.

5. The transmitting apparatus according to claim 2, wherein when said signal to be transmitted is frequency converted by a frequency mixer, said gain varying means are arranged at a previous stage of and at a rear stage of said frequency mixer, respectively, for adjusting the gain on a signal to be transmitted at a first frequency and on a signal to be transmitted at a second frequency.

6. The transmitting apparatus according to claim 2, wherein:

when said signal to be transmitted is frequency converted by a frequency mixer, said gain varying means are arranged at a previous stage of and at a rear stage of said frequency mixer, respectively, for adjusting the gain on a signal to be transmitted at a first frequency and on a signal to be transmitted at a second frequency; and a signal line having a gain changed by an attenuator is used for at least one of said plurality of signal lines, as to said gain varying means for adjusting the gain for said signal to be transmitted at the second frequency.

7. The transmitting apparatus according to claim 1, wherein a signal line having a gain changed by an attenuator is used for at least one of said plurality of signal lines.

8. The transmitting apparatus according to claim 7, wherein said signal amplifying means includes a plurality of amplifiers attached to said plurality of signal lines for inserting said different gains in said plurality of signal lines.

9. The transmitting apparatus according to claim 7, wherein when said signal to be transmitted is frequency converted by a frequency mixer, a signal to be transmitted at a first frequency is adjusted for the gain by said gain varying means, and a signal to be transmitted at a second frequency through said frequency mixer is adjusted for the gain by a predetermined variable gain amplifier.

10. The transmitting apparatus according to claim 7, wherein when said signal to be transmitted is frequency converted by a frequency mixer, said gain varying means are arranged at a previous stage of and at a rear stage of said frequency mixer, respectively, for adjusting the gain on a signal to be transmitted at a first frequency and on a signal to be transmitted at a second frequency.

11. The transmitting apparatus according to claim 1, wherein said signal amplifying means includes a plurality of amplifiers attached to said plurality of signal lines for inserting said different gains in said plurality of signal lines.

12. The transmitting apparatus according to claim 1, wherein when said signal to be transmitted is frequency converted by a frequency mixer, a signal to be transmitted at a first frequency is adjusted for gain by said gain varying means, and a signal to be transmitted at a second frequency through said frequency mixer is adjusted for gain by a variable gain amplifier.

13. The transmitting apparatus according to claim 1, wherein when said signal to be transmitted is frequency converted by a frequency mixer, said gain varying means are arranged at a previous stage of and at a rear stage of said frequency mixer, respectively, for adjusting the gain on a signal to be transmitted at a first frequency and on a signal to be transmitted at a second frequency.

14. The transmitting apparatus according to claim 1, wherein:

when said signal to be transmitted is frequency converted by a frequency mixer, said gain varying means are arranged at a previous stage of and at a rear stage of said frequency mixer, respectively, for adjusting the gain on a signal to be transmitted at a first frequency and on a signal to be transmitted at a second frequency; and a transmission path having no signal amplifying means is used for at least one of the plurality of signal lines, as to said gain varying means for adjusting the gain on said signal to be transmitted at the second frequency.

15. The transmitting apparatus according to claim 1, wherein:

when said signal to be transmitted is frequency converted by a frequency mixer, said gain varying means are arranged at a previous stage of and at a rear stage of said frequency mixer, respectively, for adjusting the gain on a signal to be transmitted at a first frequency and on a signal to be transmitted at a second frequency; and a signal line having a gain changed by an attenuator is used for at least one of the plurality of signal lines, as to said gain varying means for adjusting the gain for said signal to be transmitted at the second frequency.

16. The transmitting apparatus according to claim 1, wherein said second signal line selecting means is formed by a directional coupler composed of two parallel lines.

17. The transmitting apparatus according to claim 16, wherein:

one end of a first line of said directional coupler is connected to a first signal line of said plurality of signal lines and the other end of said first line is used as said at least one output terminal of said second signal line selecting means; and one end of a second line of said directional coupler is connected to a second signal line of said plurality of signal lines and the other end of said second line is connected to predetermined signal level detecting means.

18. A transmitting apparatus having gain varying means for adjusting a gain of a signal to be transmitted using said gain varying means, wherein said gain varying means comprises:

first signal line selecting means having a plurality of input terminals, a plurality of output terminals, and a control terminal for switching a connection relationship between said plurality of input terminals and said plurality of output terminals;

second signal line selecting means having a plurality of input terminals, at least one output terminal, and a control terminal for switching a connection relationship between said plurality of input terminals and said at least one output terminal;

third signal line selecting means having at least one input terminal, a plurality of output terminals, and a control terminal for switching a connection relationship between said at least one input terminal and said plurality of output terminals;

a plurality of first signal lines for connecting, on a one-by-one basis, said plurality of output terminals of said first signal line selecting means to said plurality of input terminals of said second signal line selecting means, and having different gains from each other by signal amplifying means;

a plurality of second signal lines for connecting, on a one-by-one basis, said plurality of output terminals of said third signal line selecting means to said plurality of input terminals of said first signal line selecting means, and having different pass band characteristics from each other by filter means; and signal line control means for controlling the switching of the connection relationship in each of said first signal line selecting means, said second signal line selecting means, and said third signal line selecting means by applying control signals to said control terminal of said first signal line selecting means, said second signal line selecting means, and said third signal line selecting means, respectively, wherein said signal line control means selects an optimal signal line from said plurality of first signal lines and said plurality of second signal lines for adjusting the gain on a signal to be transmitted, which is supplied to the at least one input terminal of said third signal line selecting means, and to switch a pass band.

19. The transmitting apparatus according to claim 18, wherein a transmission path having no signal amplifying means is used for at least one of said plurality of first signal lines.

20. The transmitting apparatus according to claim 18, wherein a signal line having a gain changed by an attenuator is used for at least one of said plurality of first signal lines.

21. The transmitting apparatus according to claim 18, wherein each of said first signal line selecting means, said second signal line selecting means, and said third signal line selecting means comprises a circular switch formed of four switches connected in a circular shape when the number of input and output terminals are both "2", wherein opposite two of four connection cross-points are designated as said plurality of input terminals, while the remaining two are designated as said plurality of output terminals of said first signal line selecting means, said second signal line selecting means and said third signal line selecting means, so that each of said plurality of input terminals and said plurality of output terminals are respectively connected by a single switch.

22. The transmitting apparatus according to claim 18, wherein said signal amplifying means includes a plurality of amplifiers attached to said plurality of first signal lines for inserting said different gains in said plurality of first signal lines.

23. The transmitting apparatus according to claim 18, wherein said second signal line selecting means is formed by a directional coupler composed of two parallel lines.

24. The transmitting apparatus according to claim 23, wherein one end of a first line of said directional coupler is connected to a first signal line of said plurality of first signal lines and the other end of said first line is used as said at least one output terminal of said second signal line selecting means; and one end of a second line of said directional coupler is connected to a second signal line of said first plurality of signal lines and the other end of said second line is connected to predetermined signal level detecting means.

25. A transmitting apparatus having gain varying means for adjusting a gain of a signal to be transmitted using said gain varying means, wherein said gain varying means comprises:

first signal line selecting means having at least one input terminal, a plurality of output terminals, and a control terminal for switching a connection relationship between said at least one input terminal and said plurality of output terminals;

second signal line selecting means having a plurality of input terminals, a plurality of output terminals, and a control terminal for switching a connection relationship between said plurality of input terminals and said plurality of output terminals;

third signal line selecting means having a plurality of input terminals, at least one output terminal, and a control terminal for switching a connection relationship between said plurality of input terminals and said at least one output terminal;

a plurality of first signal lines for connecting, on a one-by-one basis, said plurality of output terminals of said first signal line selecting means to said plurality of input terminals of said second signal line selecting means, and having different gains from each other by signal amplifying means;

a plurality of second signal lines for connecting, on a one-by-one basis, said plurality of output terminals of said second signal line selecting means to said plurality of input terminals of said third signal line selecting means, and having different pass band characteristics from each other by filter means; and signal line control means for controlling the switching of the connection relationship in each of said first signal line selecting means, said second signal line selecting means, and said third signal line selecting means by applying control signals to said control terminal of said first signal line selecting means, said second signal line selecting means, and said third signal line selecting means, respectively, wherein said signal line control means selects an optimal signal line from said plurality of first signal lines and said plurality of second signal lines for adjusting the gain on a signal to be transmitted, which is supplied to at least one input terminal of said first signal line selecting means, and to switch a pass band.

26. The transmitting apparatus according to claim 25, wherein
a transmission path having no signal amplifying means is used for at least one of said plurality of first signal lines.

27. The transmitting apparatus according to claim 25, wherein
a signal line having a gain changed by an attenuator is used for at least one of said plurality of first signal lines.

28. The transmitting apparatus according to claim 25, wherein
each of said first signal line selecting means, said second signal line selecting means, and said third signal line selecting means comprises a circular switch formed of four switches connected in a circular shape when the number of input and output terminals are both "2", wherein opposite two of four connection cross-points are designated as said plurality of input terminals of said first signal line selecting means, said second signal line selecting means, and said third signal line selecting means, while the remaining two are designated as said plurality of output terminals said first signal line selecting means, said second signal line selecting means, and said third signal line selecting means, so that said plurality of input terminals and said plurality of output terminals are respectively connected by a single switch.

29. The transmitting apparatus according to claim 25, wherein
said signal amplifying means includes a plurality of amplifiers attached to said plurality of first signal lines for inserting said different gains in said plurality of first signal lines.

30. The transmitting apparatus according to claim 25, wherein
said third signal line selecting means is formed by a directional coupler composed of two parallel lines.

31. The transmitting apparatus according to claim 30, wherein:
one end of a first line of said directional coupler is connected to a first signal line of said plurality of second signal lines and the other end of said first line is used as said at least one output terminal of said third signal line selecting means; and one end of a second line of said directional coupler is connected to a second signal line of said plurality of second signal lines and the other end of said second line is connected to predetermined signal level detecting means.

32. A transmitting apparatus having gain varying means for adjusting a gain of a signal to be transmitted using said gain varying means, wherein said gain varying means comprises:
first signal line selecting means having a plurality of input terminals, a plurality of output terminals, and a control terminal for switching a connection relationship between said plurality of input terminals and said plurality of output terminals;
second signal line selecting means having a plurality of input terminals, a plurality of output terminals, and a control terminal for switching a connection relationship between said plurality of input terminals and said plurality of output terminals;
third signal line selecting means having at least one input terminal, a plurality of output terminals, and a control terminal for switching a connection relationship between said at least one input terminals and said plurality of output terminals;
fourth signal line selecting means having a plurality of input terminals, at least one output terminal, and a control terminal for switching a connection relationship between said plurality of input terminals and said at least one output terminal;
a plurality of first signal lines for connecting, on a one-by-one basis, said plurality of output terminals of said first signal line selecting means to said plurality of input terminals of said second signal line selecting means, and having different gains from each other by signal amplifying means;
a plurality of second signal lines for connecting, on a one-by-one basis, said plurality of output terminals of said third signal line selecting means to said plurality of input terminals of said first signal line selecting means, and having different pass band characteristics from each other by filter means;
a plurality of third signal lines for connecting, on a one-by-one basis, said plurality of output terminals of said second signal line selecting means to said plurality of input terminals of said fourth signal line selecting means, and having different pass band characteristics from each other by filter means; and
signal line control means for controlling the switching of the connection relationship in each of said first line selecting means, said second line selecting means, said third line selecting means, and said fourth signal line selecting means by applying control signals to said control terminal of each of said first line selecting means, said second line selecting means, said third line selecting means, and said fourth signal line selecting means,
wherein said signal line control means selects an optimal signal line from said plurality of first, said plurality of second, and said plurality of third signal lines for adjusting the gain on a signal to be transmitted, which is supplied to at least one input terminal of said third signal line selecting means, and to switch a pass band.

33. The transmitting apparatus according to claim 32, wherein
a transmission path having no signal amplifying means is used for at least one of said plurality of first signal lines.

34. The transmitting apparatus according to claim 32, wherein
a signal line having a gain changed by an attenuator is used for at least one of said plurality of first signal lines.

35. The transmitting apparatus according to claim 32, wherein
each of said first signal line selecting means, said second signal line selecting means, said third signal line selecting means, and said fourth signal line selecting means comprises a circular switch formed of four switches connected in a circular shape when the number of input and output terminals are both "2", wherein opposite two of four connection cross-points are designated as said plurality of input terminals of said first line selecting means, said second line selecting means, said third line selecting means, and said fourth line selecting means, while the remaining two are designated as said plurality of output terminals of said first line selecting means, said second line selecting means, said third line selecting means, and said fourth line selecting means, so that said plurality of input terminals and said plurality of output terminals are respectively connected by a single switch.

36. The transmitting apparatus according to claim 32, wherein said amplifying means includes a plurality of amplifiers attached to said plurality of first signal lines for inserting said different gains in said plurality of first signal lines.

37. The transmitting apparatus according to claim 32, wherein said fourth signal line selecting means is formed by a directional coupler composed of two parallel lines.

38. The transmitting apparatus according to claim 37, wherein:

one end of a first line of said directional coupler is connected to a first signal line of said plurality of third signal lines and the other end of said first line is used as said at least one output terminal of said fourth signal line selecting means; and one end of a second line of said directional coupler is connected to a second signal line of said plurality of third signal lines and the other end of said second line is connected to predetermined signal level detecting means.

39. The method of adjusting a gain of a signal to be transmitted, comprising the steps of:

providing a plurality of signal lines having different gains from each other by signal amplifying means;

examining a first level of a signal to be transmitted, required at an output side of said signal line, and examining a second level of the signal to be transmitted on an input side of said signal line;

determining which signal line of said plurality of signal lines is selected in accordance with a level difference between said first level and said second level; and optimally adjusting the gain on said signal to be transmitted by appropriately selecting said signal line in accordance with a result of said determining step.

* * * * *